(12) United States Patent
Yamauchi et al.

(10) Patent No.: US 11,011,846 B2
(45) Date of Patent: May 18, 2021

(54) ANTENNA AND SEMICONDUCTOR DEVICE WITH IMPROVED TRADEOFF RELATIONSHIP BETWEEN ANTENNA GAIN AND ANTENNA SIZE

(71) Applicant: LAPIS SEMICONDUCTOR CO., LTD., Kanagawa (JP)

(72) Inventors: Shigeki Yamauchi, Kanagawa (JP); Fukuro Koshiji, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 61 days.

(21) Appl. No.: 16/393,740

(22) Filed: Apr. 24, 2019

(65) Prior Publication Data
US 2019/0341697 A1 Nov. 7, 2019

(30) Foreign Application Priority Data
May 2, 2018 (JP) .............................. JP2018-088761

(51) Int. Cl.
*H01L 23/66* (2006.01)
*H01Q 9/28* (2006.01)
*H01Q 1/22* (2006.01)

(52) U.S. Cl.
CPC ............ *H01Q 9/285* (2013.01); *H01L 23/66* (2013.01); *H01Q 1/2283* (2013.01); *H01L 2223/6677* (2013.01)

(58) Field of Classification Search
CPC ................................ H01G 9/285; H01L 23/66

USPC ......................................................... 257/773
See application file for complete search history.

(56) References Cited

U.S. PATENT DOCUMENTS

| | | | |
|---|---|---|---|
| 2008/0129606 A1* | 6/2008 | Yanagisawa ............. | H01Q 7/00 343/700 MS |
| 2013/0307746 A1* | 11/2013 | Nakano ................ | H01Q 1/2225 343/850 |
| 2014/0246745 A1* | 9/2014 | Kinugasa ................ | H01L 23/66 257/341 |
| 2016/0380340 A1* | 12/2016 | Inoue ..................... | H01Q 21/08 343/702 |
| 2017/0301997 A1* | 10/2017 | Kosaka ................ | H04B 7/0608 |
| 2018/0205133 A1* | 7/2018 | Hashimoto .......... | H01Q 13/106 |
| 2019/0386389 A1* | 12/2019 | Ichikawa .............. | H02J 50/402 |

FOREIGN PATENT DOCUMENTS

| JP | 2014170811 A | 9/2014 |
|---|---|---|
| JP | 2016163216 A | 9/2016 |

* cited by examiner

*Primary Examiner* — Jami Valentine Miller
(74) *Attorney, Agent, or Firm* — Volentine, Whitt & Francos, PLLC

(57) ABSTRACT

An antenna including: a first conductor portion including a power supply point at which one of a pair of differential signals is input; a second conductor portion including a power supply point at which another one of the pair of differential signals is input, the second conductor portion being separated by a gap from the first conductor portion; and a third conductor portion that connects the first conductor portion with the second conductor portion, wherein the gap includes a portion having a width that becomes progressively wider in a direction moving away from the third conductor portion.

10 Claims, 27 Drawing Sheets

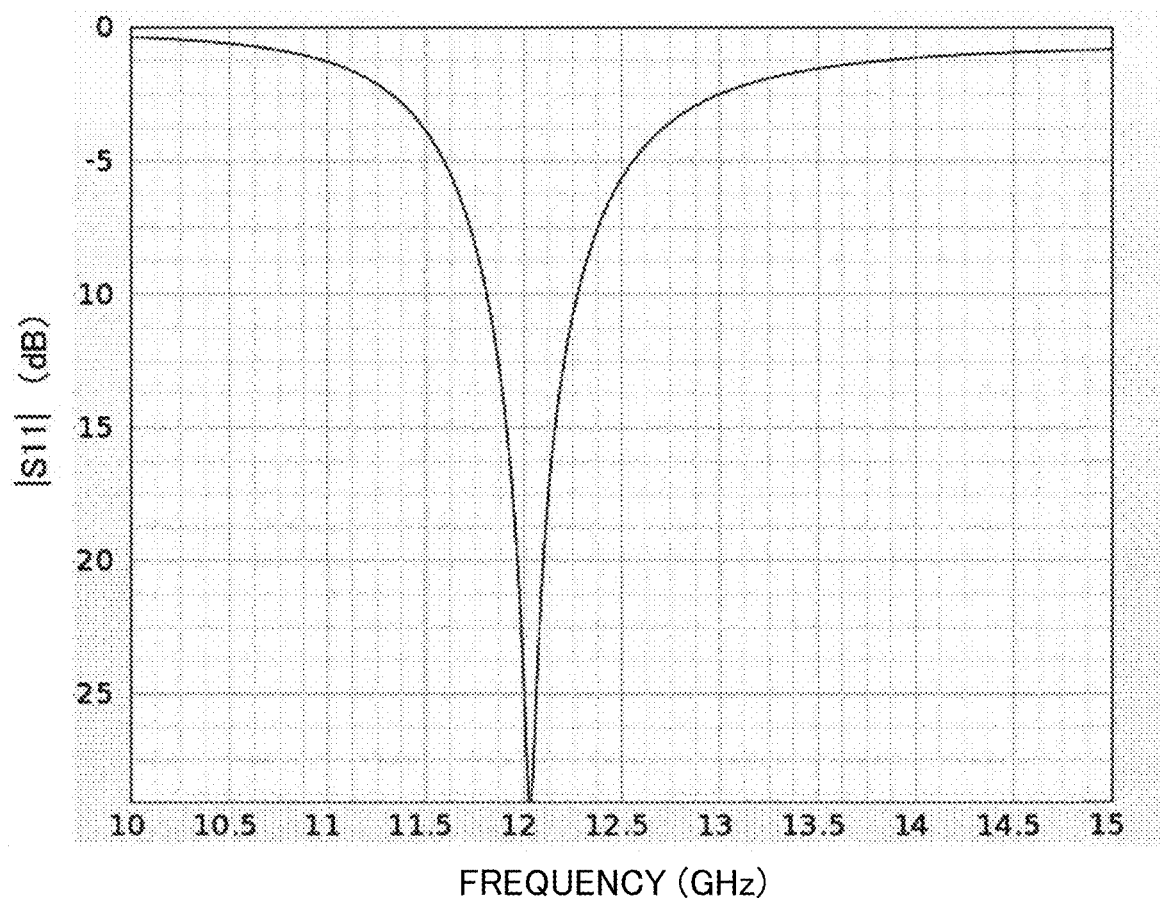

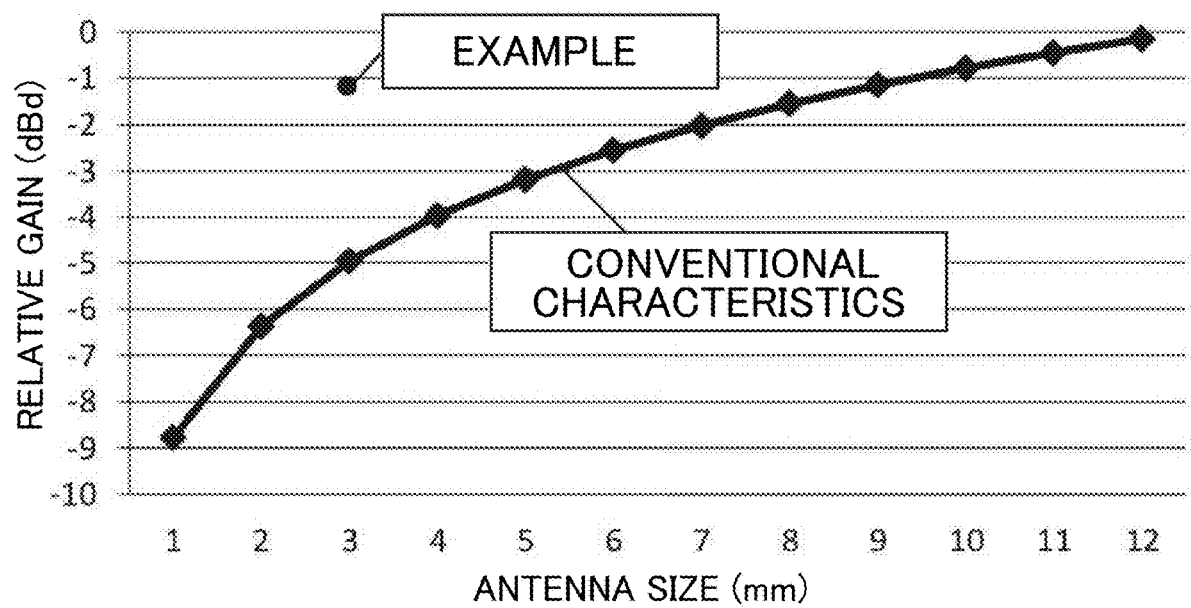

ANTENNA AND SEMICONDUCTOR DEVICE WITH IMPROVED TRADEOFF RELATIONSHIP BETWEEN ANTENNA GAIN AND ANTENNA SIZE

CROSS-REFERENCE TO RELATED APPLICATION

This application is based on and claims priority under 35 USC 119 from Japanese Patent Application No. 2018-088761, filed on May 2, 2018, the disclosure of which is incorporated by reference herein.

BACKGROUND

Technical Field

The present disclosure relates to an antenna and a semiconductor device.

Related Art

For example, as a technology relating to a semiconductor having an antenna, the technology described below is known.

For example, Japanese Patent Application Laid-Open (JP-A) No. 2014-170811, discloses a CSP (Chip Size Package) that has an antenna used for wireless communication performed by transmitting signals to, and receiving signals from an external substrate, with the antenna being formed by the wiring of a rewiring layer disposed between a silicon layer and solder bumps.

Moreover, JP-A No. 2016-163216, discloses an antenna-integrated module including: at least one semiconductor chip in which a wiring layer is disposed on a first surface of a silicon substrate and that includes at least one frequency conversion unit; an insulating layer disposed to enclose the semiconductor chip; a rewiring layer disposed on a first surface of the insulating layer and a first surface of the wiring layer; at least one first antenna element formed by a semiconductor pattern on the first surface of the wiring layer and is connected to the frequency conversion unit; and at least one second antenna element formed by a wiring pattern on a first surface of the rewiring layer that is disposed on the first surface of the insulating layer, and that is connected to the frequency conversion unit.

Due to increases in the quantity of data being transferred, wireless communication systems of recent years require wide frequency bands for the transfer of this data. Since of this, there are cases in which system frequencies being allocated to comparatively open high-frequency bands (for example, 10 GHz or higher) in which broadband frequency allocation is possible. In addition, modern electronic devices have a greater need for miniaturization, and such miniaturization is currently highly desired.

However, generally, antennas used in wireless communication systems decreases its gain as the size thereof is reduced. In other words, it is difficult to reduce the size of an antenna while maintaining that the gain of the antenna.

SUMMARY

The present disclosure provides an antenna and semiconductor device that may improve the tradeoff relationship between antenna gain and antenna size.

A first aspect of the present disclosure is an antenna including: a first conductor portion including a power supply point at which one of a pair of differential signals is input; a second conductor portion including a power supply point at which another one of the pair of differential signals is input, the second conductor portion being separated by a gap from the first conductor portion; and a third conductor portion that connects the first conductor portion with the second conductor portion, wherein the gap includes a portion having a width that becomes progressively wider in a direction moving away from the third conductor portion.

A second aspect of the present disclosure is an antenna including: a first antenna portion and a second antenna portion, the first antenna portion including: a first conductor portion including a power supply point at which one of a pair of differential signals is input, a second conductor portion including a power supply point at which another one of the pair of differential signals is input, the second conductor portion being separated by a gap from the first conductor portion, and a third conductor portion that connects the first conductor portion with the second conductor portion, wherein the gap includes a portion having a width that becomes progressively wider in a direction moving away from the third conductor portion.

A third aspect of the present disclosure is a semiconductor device including: a semiconductor substrate; a wiring layer provided at a surface of the semiconductor substrate; a rewiring layer provided at a surface of the wiring layer, with an insulating layer provided between the rewiring layer and the surface of the wiring layer; and an antenna provided on the rewiring layer, the antenna including: a first conductor portion including a power supply point at which one of a pair of differential signals is input, a second conductor portion including a power supply point at which another one of the pair of differential signals is input, the second conductor portion being separated by a gap from the first conductor portion, and a third conductor portion that connects the first conductor portion with the second conductor portion, wherein the gap includes a portion having a width that becomes progressively wider in a direction moving away from the third conductor portion.

A fourth aspect of the present disclosure is a semiconductor device including: a semiconductor substrate; a wiring layer provided at a surface of the semiconductor substrate; a first rewiring layer provided at a surface of the wiring layer, with a first insulating layer provided between the first rewiring layer and the surface of the wiring layer; a second rewiring layer provided at a surface of the first rewiring layer, with a second insulating layer provided between the second rewiring layer and the surface of the first rewiring layer; a first antenna portion provided on the first rewiring layer; and a second antenna portion provided on the second rewiring layer at a position that overlaps with the first antenna portion.

According to the above aspects, the present disclosure provides an antenna and semiconductor device that may improve the tradeoff relationship between antenna gain and antenna size.

BRIEF DESCRIPTION OF THE DRAWINGS

Exemplary embodiments of the present disclosure will be described in detail based on the following figures, wherein:

FIG. 3 is a graph illustrating frequency characteristics of an S11 parameter in an antenna according to an exemplary embodiment of the present disclosure;

FIG. 5 is a graph illustrating a relationship between antenna size (i.e., maximum external dimensions) and relative gain in a conventional antenna;

DETAILED DESCRIPTION

Hereinafter, exemplary embodiments of the present disclosure will be described in detail based on the drawings. Note that component elements or portions that are essentially either the same or equivalent in each drawing are given the same reference symbols.

First Exemplary Embodiment

Figure 1A:
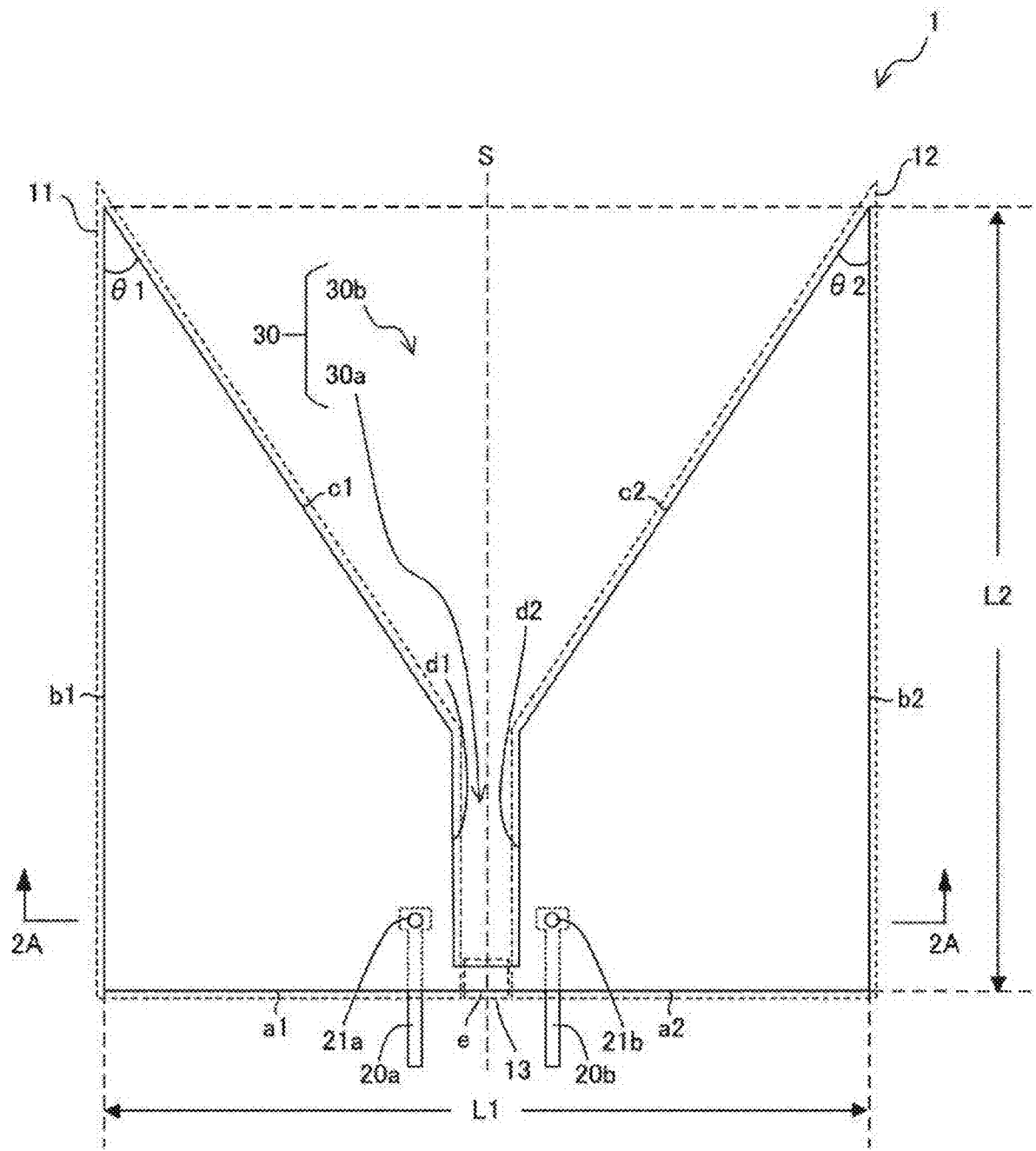
FIG. 1A is a plan view illustrating the structure of an antenna according to an exemplary embodiment of the present disclosure.
Figure 2A:
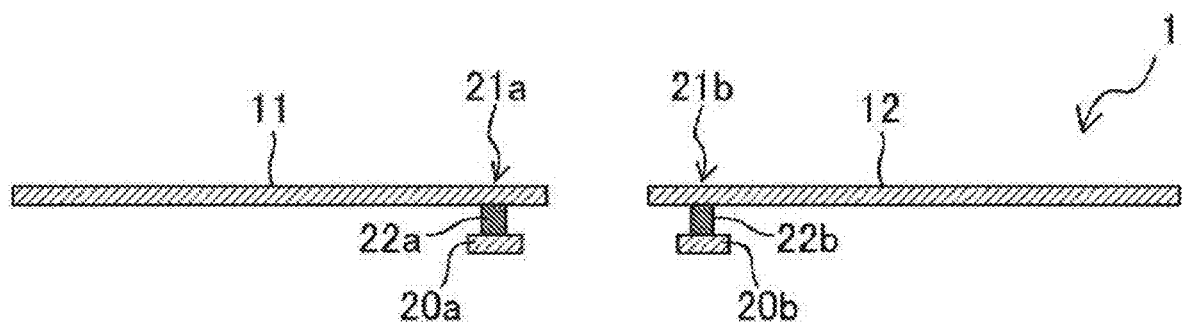
FIG. 2A is a cross-sectional view taken across a line 2A-2A in FIG. 1A.

FIG. 1A is a plan view illustrating an example of the structure of an antenna 1 according to a first exemplary embodiment of the present disclosure. FIG. 2A is a cross-sectional view taken across a line 2A-2A in FIG. 1A.

The antenna 1 is formed to include a first conductor portion 11, a second conductor portion 12, and a third conductor portion 13. The first conductor portion 11, the second conductor portion 12, and the third conductor portion 13 are formed by a thin film formed of a conductive material such as, for example, gold, silver, copper, or aluminum.

Figure 1B:
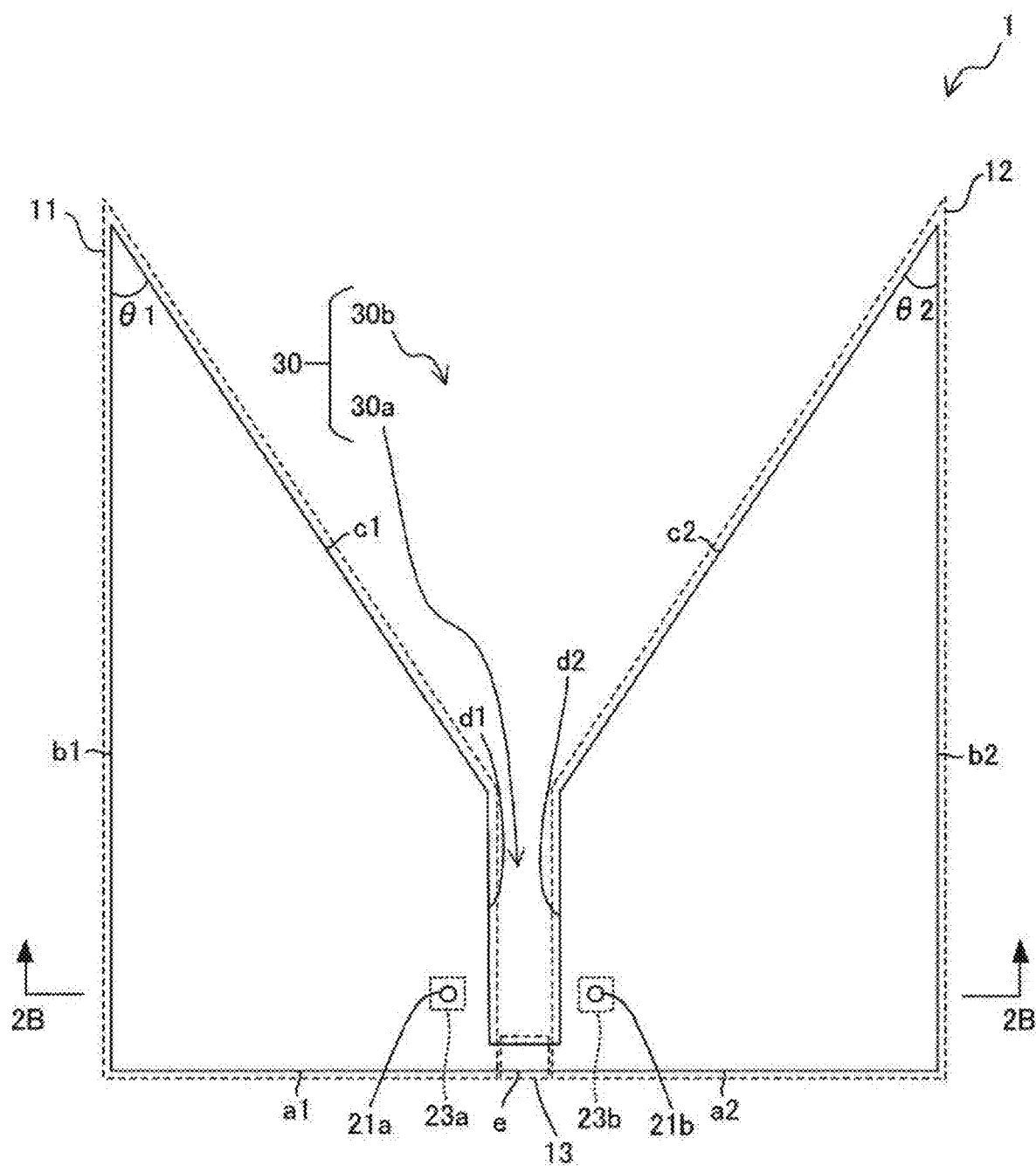
FIG. 1B is a plan view illustrating the structure of an antenna according to an exemplary embodiment of the present disclosure.
Figure 2B:
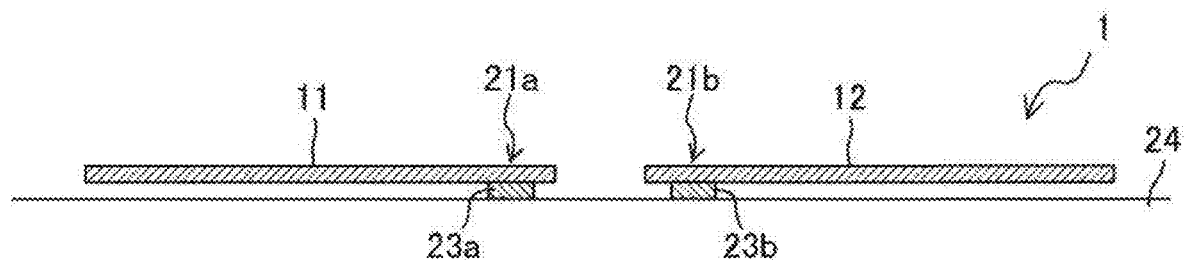
FIG. 2B is a cross-sectional view taken across a line 2B-2B in FIG. 1B.

The first conductor portion 11 has a power supply point 21a to which one of a pair of differential signals is input via signal wiring 20a. In the same way, the second conductor portion 12 has a power supply point 21b to which the other of the pair of differential signals is input via signal wiring 20b. The antenna 1 receives differential signals input via the first signal wiring 20a and the second signal wiring 20b, emits radio waves to the outside, and receives radio waves arriving from the outside. FIG. 1B is a plan view illustrating another example of the structure of the antenna 1 according to the first exemplary embodiment of the present disclosure. FIG. 2B is a cross-sectional view taken across a line 2B-2B in FIG. 1B. As illustrated in FIG. 1B and FIG. 2B, chip electrodes 23a and 23b that are formed on a semiconductor substrate 24 are directly connected to the antenna 1, and the connecting portions between the chip electrodes 23a and 23b and the antenna 1 may be used to form the power supply points 21a and 21b of the antenna 1.

The second conductive portion 12 is separated from the first conductive portion 11 by a gap 30 which is provided therebetween. The third conductor portion 13 connects the first conductor portion 11 to the second conductor portion 12. In other words, the antenna 1 has an integrated configuration in which the first conductor portion 11, the second conductor portion 12, and the third conductor portion 13 are formed as an integrated unit.

The gap 30 provided between the first conductor portion 11 and the second conductor portion 12 has a portion whose width becomes progressively wider in a direction moving away from third conductor portion 13. An external shape of the overall antenna 1 including the first conductor portion 11, the second conductor portion 12, and the third conductor portion 13 is a line-symmetric shape whose axis of symmetry is a straight line S passing through the third conductor portion 13.

In the present exemplary embodiment, the external shapes of the first conductor portion and the second conductor portion 12 are both trapezoids, and in the layout illustrated in FIG. 1A, are in a left-right inverted relationship to each other. Sides a1, b1, c1, and d1 of the first conductor portion 11 correspond respectively to sides a2, b2, c2, and d2 of the second conductor portion 12, and these mutually corresponding sides have the same lengths as each other.

The side b1, the side d1, the side b2, and the side d2 are mutually parallel with each other, and are perpendicular relative to the side a1 and the side a2. The side a1, the side a2, and a side e of the third conductor portion 13 are each provided on the same straight line. The side c1 is inclined relative to the side b1 and the side d1. In the same way, the side c2 is inclined relative to the side b2 and the side d2. An angle θ1 formed between the side b1 and the side c1 is an acute angle and, in the same way, an angle θ2 formed between the side b2 and the side c2 is also an acute angle.

The third conductor portion 13 is connected to the first conductor portion 11 and the second conductor portion 12 via end portions respectively of the side d1 and the side d2. The gap 30 provided between the first conductor portion 11 and the second conductor portion 12 includes a first portion 30a that is sandwiched between the side d1 and the side d2 which are mutually parallel, and a second portion 30b that is sandwiched between the side c1 and the side c2 which are both inclined.

The signal wiring 20a and 20b are provided in a different layer from the layer in which the antenna 1 is provided, and are electrically connected to the antenna 1 using an interlayer connecting device such as a via 22a and a via 22b. The respective connecting portions where the antenna 1 is connected to the via 22a and the via 22b are the power supply points 21a and 21b of the antenna 1.

According to the antenna 1 having the above-described structure, the emission frequency of the antenna 1 can be adjusted by adjusting the size thereof. In other words, the frequency characteristics of the antenna 1 can be altered by altering the size of the antenna 1. FIG. 3 is a graph illustrating an example of the frequency characteristics of an S11 parameter when a length L1 of a side made up of the side a1, the side a2, and the side e, and a length L2 of the side b1 and the side b2 are set respectively to 3 mm. In other words, the graph illustrated in FIG. 3 shows frequency characteristics of reflection loss in the antenna 1. According to the antenna 1, by setting L1 and L2 respectively to 3 mm, an antenna suitable for signal transmissions having a frequency in the vicinity of 12 GHz can be formed. According to the antenna 1, by shortening both L1 and L2, the frequency where high-efficiency emissions are achieved can be shifted to the high frequency side, while by lengthening both L1 and L2, the frequency where high-efficiency emissions are achieved can be shifted to the low frequency side.

Figure 4A:
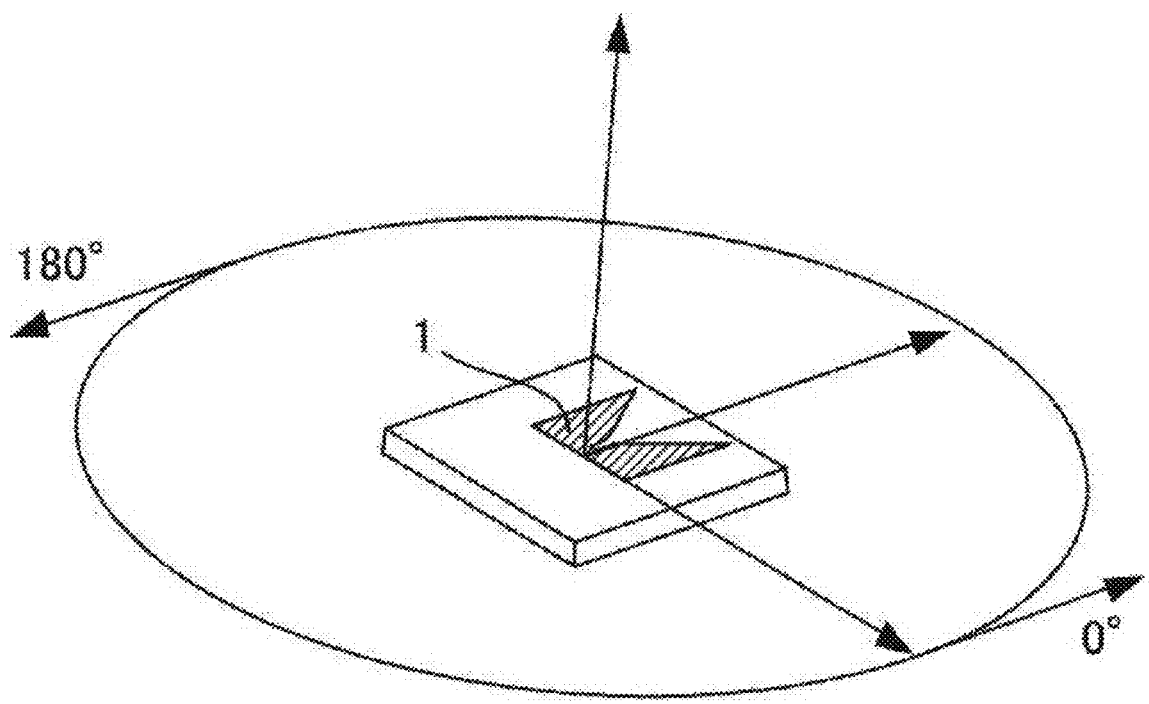
FIG. 4A is a view illustrating an orientation of an antenna when an emission pattern illustrated in FIG. 4B is acquired.
Figure 4B:
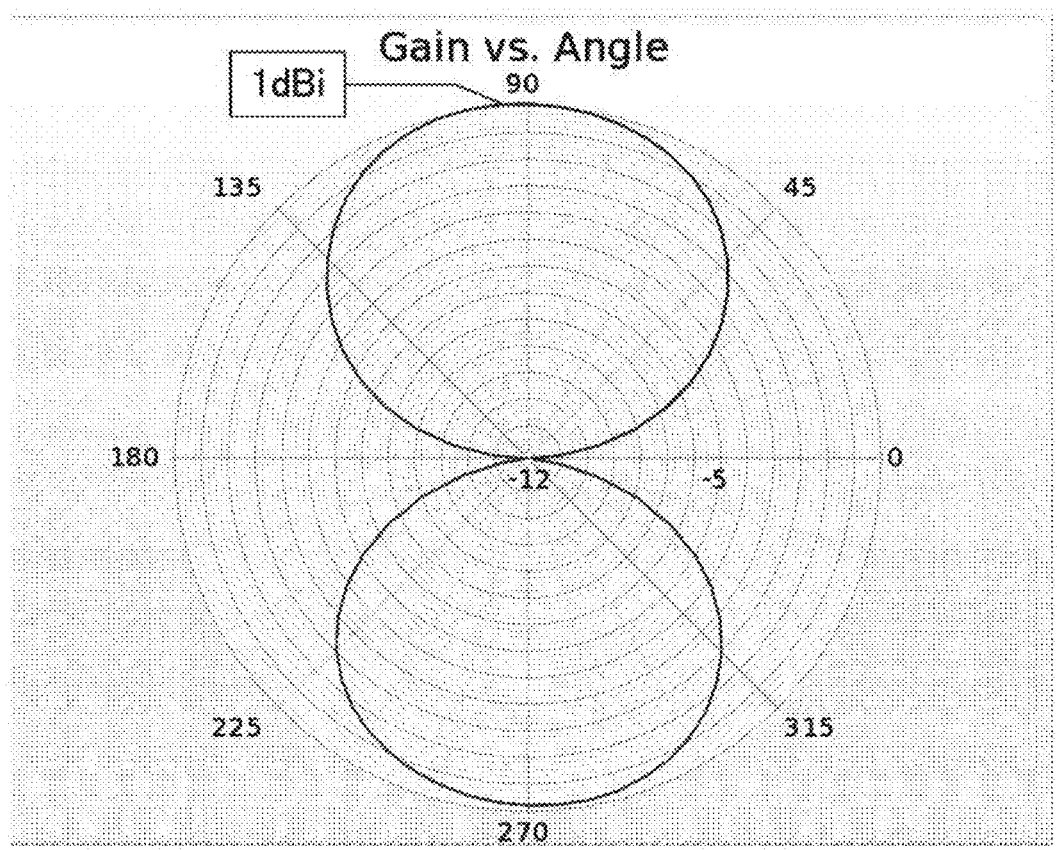
FIG. 4B is a view illustrating an emission pattern of an antenna according to an exemplary embodiment of the present disclosure.

FIG. 4B shows an example of an emission pattern of the antenna 1 on a circumference illustrated in FIG. 4A when L1 and L2 are both set to 3 mm, and a differential signal of 12 GHz is input to the antenna 1. As illustrated in FIG. 4B, the antenna 1 has directionality in a 90° direction, and a 270° direction, and an absolute gain of approximately 1 dBi.

Generally, it is known that the smaller the size of an antenna, the smaller the gain thereof becomes. It is stated in "Small-size—Thin Antennas and Wireless Communication Systems" (Masaaki Shinji, Journal of the Institute of Electronics, Information and Communication Engineers, (B), Vol. 71-b, No. 11) that a relationship illustrated by Formula (1) (see below) exists between a maximum external dimension L of the antenna in actual use, and the relative gain G [dBd] of this antenna. Note that λ denotes the signal wavelength.

$$G = 8 \log(2L/\lambda) \quad (1)$$

FIG. 5 is a graph illustrating an example of a relationship between antenna size (i.e., the maximum external dimension) and relative gain of a conventional antenna created based on the above Formula (1). Note that the transmission of a signal having a frequency of 12 GHz is assumed, and the wavelength λ was set to 0.02 m.

In FIG. 5, the relative gain (−1.15 dBd) in the antenna 1 (L1=L2=3 mm) according to an example of the present disclosure has been plotted. Note that the relative gain corresponds to a value obtained by subtracting 2.15 dB from the absolute gain. Based on Formula (1), according to a conventional antenna, when the antenna size is 3 mm, the relative gain is −4.95 dBd. In contrast, according to the antenna 1 according to the exemplary embodiment of the present disclosure, when the antenna size is 3 mm, the relative gain is −1.15 dBd so that, in comparison with a conventional antenna, it is possible to obtain a markedly higher gain. In other words, according to the antenna 1 according to the exemplary embodiment of the present disclosure, even with an antenna size of 3 mm, which corresponds to one eighth of the signal wavelength λ, it is still possible to attain a high emission efficiency of 87.2%. In this way, according to the antenna 1 of the present exemplary embodiment, the trade-off relationship between antenna gain and antenna size may be improved.

Furthermore, according to the antenna 1, by changing the positions of the power supply points 21a and 21b, the impedance of the antenna 1 can be changed. In other words, by adjusting the positions of the power supply points 21a and 21b, the impedances between the signal wiring 20a and the signal wiring 20b may be made to conform with each other.

Note that, in the present exemplary embodiment, a case in which the first conductor portion 11 and the second conductor portion 12 have polygonal-shaped external configurations that include plural sides, is described. However, the present disclosure is not limited to this. Either a part of or all of the external configurations of the first conductor portion 11 and the second conductor portion 12 may have a curved shape, or may have a meandering shape. Moreover, the width dimension of the gap 30 provided between the first conductor portion 11 and the second conductor portion 12 does not need to increase monotonically in a direction moving away from the third conductor portion 13, and may also be made to increase in steps in this direction.

Second Embodiment

Figure 6:
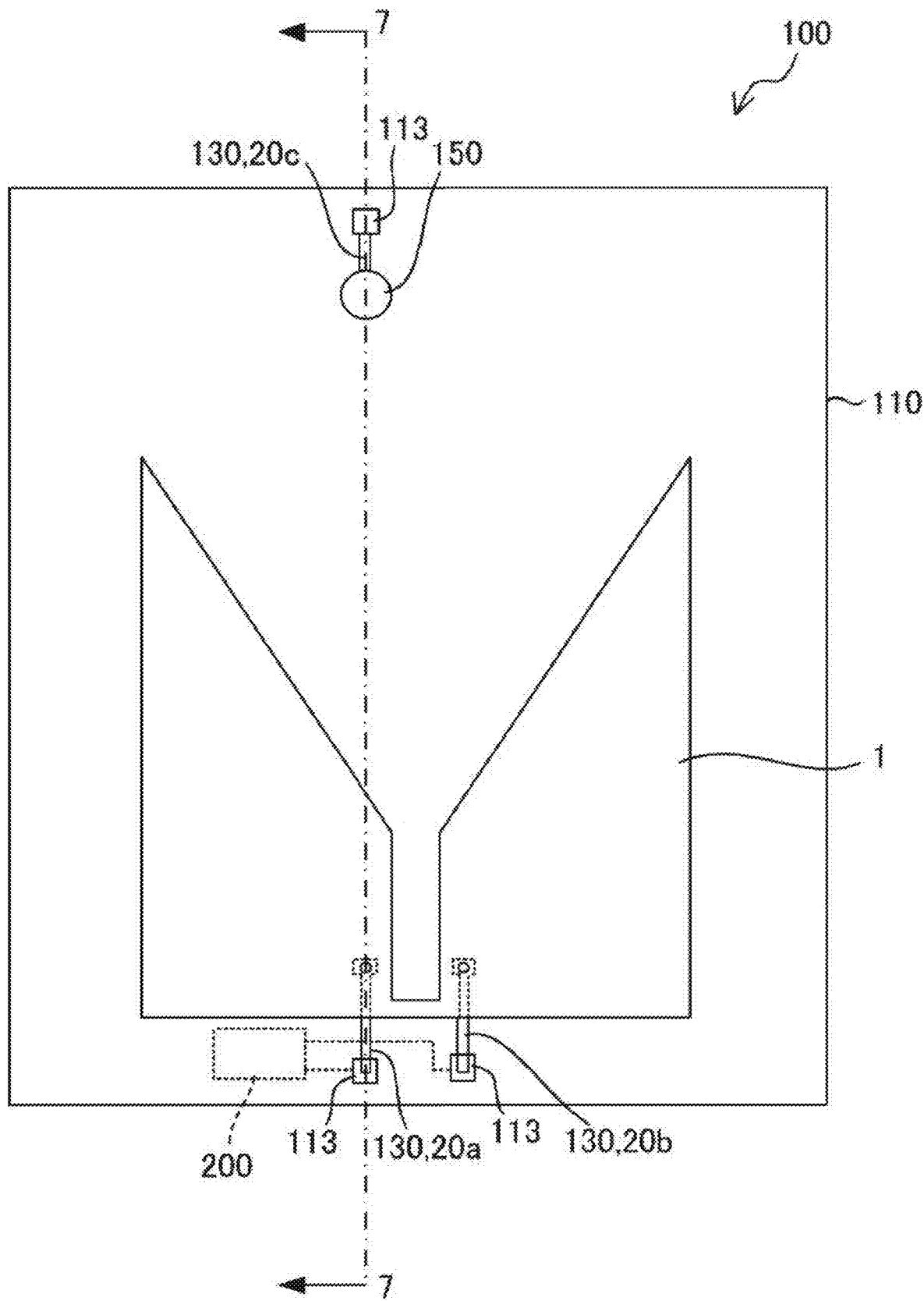
FIG. 6 is a plan view illustrating the structure of a semiconductor device according to an exemplary embodiment of the present disclosure.
Figure 7:
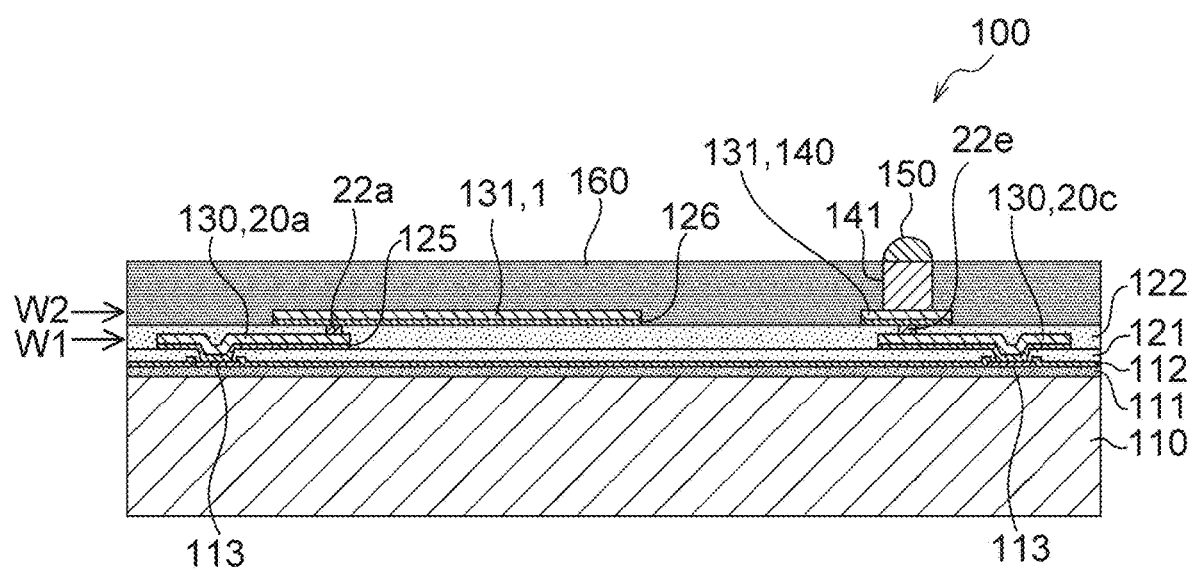
FIG. 7 is a cross-sectional view taken across a line 7-7 in FIG. 6.

FIG. 6 is a plan view illustrating an example of the structure of a semiconductor device 100 according to a second exemplary embodiment of the present disclosure on which the antenna 1 according to the above-described first exemplary embodiment is mounted. FIG. 7 is a cross-sectional view taken across a line 7-7 in FIG. 6.

The semiconductor device 100 has a semiconductor substrate 110 that is formed to include a semiconductor such as silicon or the like. In the semiconductor device 100, the package is a WL-CSP (Wafer Level Chip Size Package) type of package. In other words, in the semiconductor device 100, the planar size of the package is substantially the same as the planar size of the semiconductor substrate 110. The semiconductor device 100 is provided with a rewiring layer W1 in which rewiring 130 is provided, and a rewiring layer W2 in which rewiring 131 is provided.

A signal input/output circuit 200 is provided in the semiconductor substrate 110. A pair of differential signals produced by the signal input/output circuit 200 are input to the antenna 1 via chip electrodes 113, and the signal wiring 20a and 20b, and are also emitted from the antenna 1 via the same. In addition, radio waves arriving from the outside are received by the antenna 1, and signals based on these radio waves are input to the signal input/output circuit 200 via the signal wiring 20a and 20b.

A surface of the semiconductor substrate 110 is covered by an interlayer insulating film 111 that is formed from an insulating material such as $SiO_2$ or the like. A passivation film (i.e., a protective film) 112 having aperture portions that enable surfaces of the chip electrodes 113, that are connected to a function circuit such as the signal input/output circuit 200 which is formed on the semiconductor substrate 110, to be partially exposed is provided on the surface of the interlayer insulating film 111.

A surface of the passivation film 112 is covered by an insulating film 121 formed from a photosensitive organic insulating material such as polyimide or PBO (polybenzoxazole), and having a thickness of approximately 5 μm. Aperture portions that enable the surface of the chip electrodes 113 to be partially exposed are provided in the insulating layer 121.

The rewiring 130 is provided at a thickness of approximately 5 μm via a UBM (Under Bump Metallurgy) film 125 on a surface of the insulating film 121. The signal wiring 20a and the 20b are formed by the rewiring 130. In other words, the signal wiring 20a and 20b are provided in the rewiring layer W1.

The UBM film 125 is formed by a laminated film that includes, for example, a Ti film and a Cu film. The Ti film functions as an adhesion layer that increases adhesion between insulating film 121 and the rewiring 130. The Cu film functions as a seed layer that is used to form the rewiring 130 via an electrolytic plating process. The rewiring 130 is formed by a conductive material such as, for example, Cu, and is connected to the chip electrodes 113 through the aperture portions in the insulating film 121 via the UBM film 125. In other words, the signal input/output circuit 200 is connected to the rewiring 130 forming the signal wiring 20a and 20b via the chip electrodes 113.

The surfaces of the insulating film 121 and the rewiring 130 are formed from a photosensitive organic insulating material such as polyimide or PBO, and are covered by an insulating film 122. The thickness of the portion of the insulating film that covers the rewiring 130 is, for example, approximately 5 μm.

The rewiring 131 having a thickness of approximately 5 μm is provided via a UBM film 126 on a surface of the insulating film 122. The antenna 1 (i.e., the first conductor portion 11, the second conductor portion 12, and the third conductor portion 13 (see FIG. 1A)) are formed by the rewiring 131. In other words, the antenna 1 is provided in the rewiring layer W2. The antenna 1 and the signal wiring 20a are connected together by a via 22a. A connecting portion between the antenna 1 and the via 22a forms the power supply point 21a (see FIG. 6) of the antenna 1. Rewiring (not illustrated in FIG. 7) that forms the signal wiring 20b is provided in the rewiring layer W1, and this rewiring is also connected to the antenna 1 by means of a via. A connecting portion between the antenna 1 and this via (not illustrated in the drawings) forms the power supply point 21b (see FIG. 6) of the antenna 1.

In addition, the rewiring 130 that forms the signal wiring 20c which is connected to a function circuit (not illustrated in the drawings) having a predetermined function is also provided via the chip electrodes 113 in the rewiring layer W1. Furthermore, the rewiring 131 that forms a land 140 which is connected to the signal wiring 20c by means of a via 20e is provided in the rewiring layer W2.

A post 141 formed from a conductive material such as Cu or the like is connected to the land 140. Surfaces of the insulating film 122 and the rewiring 131 are covered by sealing resin 160 having a thickness of approximately 90 μm which is formed using a resin material such as, for example, epoxy resin or the like. The post 141 is embedded inside the sealing resin 160. An external connection terminal 150 is provided on an upper end portion of the post 141 that is exposed from the surface of the sealing resin 160. The external connection terminal 150 may also have a solder ball configuration that is formed so as to include, for example, Sn—Ag—Cu solder.

According to the semiconductor device 100 of the present exemplary embodiment, the signal input/output circuit 200 and the antenna 1 are housed within a single semiconductor package. If the antenna 1 is attached to the exterior thereof, there would be considerable attenuation of the signal amplitude in the connection portion between the antenna 1 and the signal input/output circuit 200. Attenuation of the signal amplitude is more conspicuous in high frequency bands in excess of 10 GHz. According to the semiconductor device 100 of the present exemplary embodiment, since the signal input/output circuit 200 and the antenna 1 are housed within a single semiconductor package, compared with a structure in which the antenna 1 is attached to the exterior of the semiconductor, attenuation of the signal amplitude may be inhibited. Furthermore, compared with a structure in which the antenna 1 is attached to the exterior of the semiconductor, a reduction in the size of electronic devices including the semiconductor device 100 may be achieved.

It is assumed that the antenna 1 housed within the semiconductor device 100 is formed having a millimeter-order size. According to the antenna 1 of the present exemplary embodiment, as described above, since the antenna 1 may improve the trade-off relationship between antenna gain and antenna size, this antenna 1 is preferably used as a ultra-small antenna that is capable of being housed in a semiconductor package.

Note that, one method to achieve an even greater reduction in the size of the antenna 1 is to increase the thickness of the sealing resin 160. By employing this method, the dielectric constant of the package may be increased and, as a result, the wavelength of signals emitted from the antenna 1 may be shortened. Since the size of an antenna that is used to obtain a desired gain is governed by the wavelength of the signal, by shortening the wavelength of the signal, the size of the antenna may also be reduced.

Third Exemplary Embodiment

Figure 8:
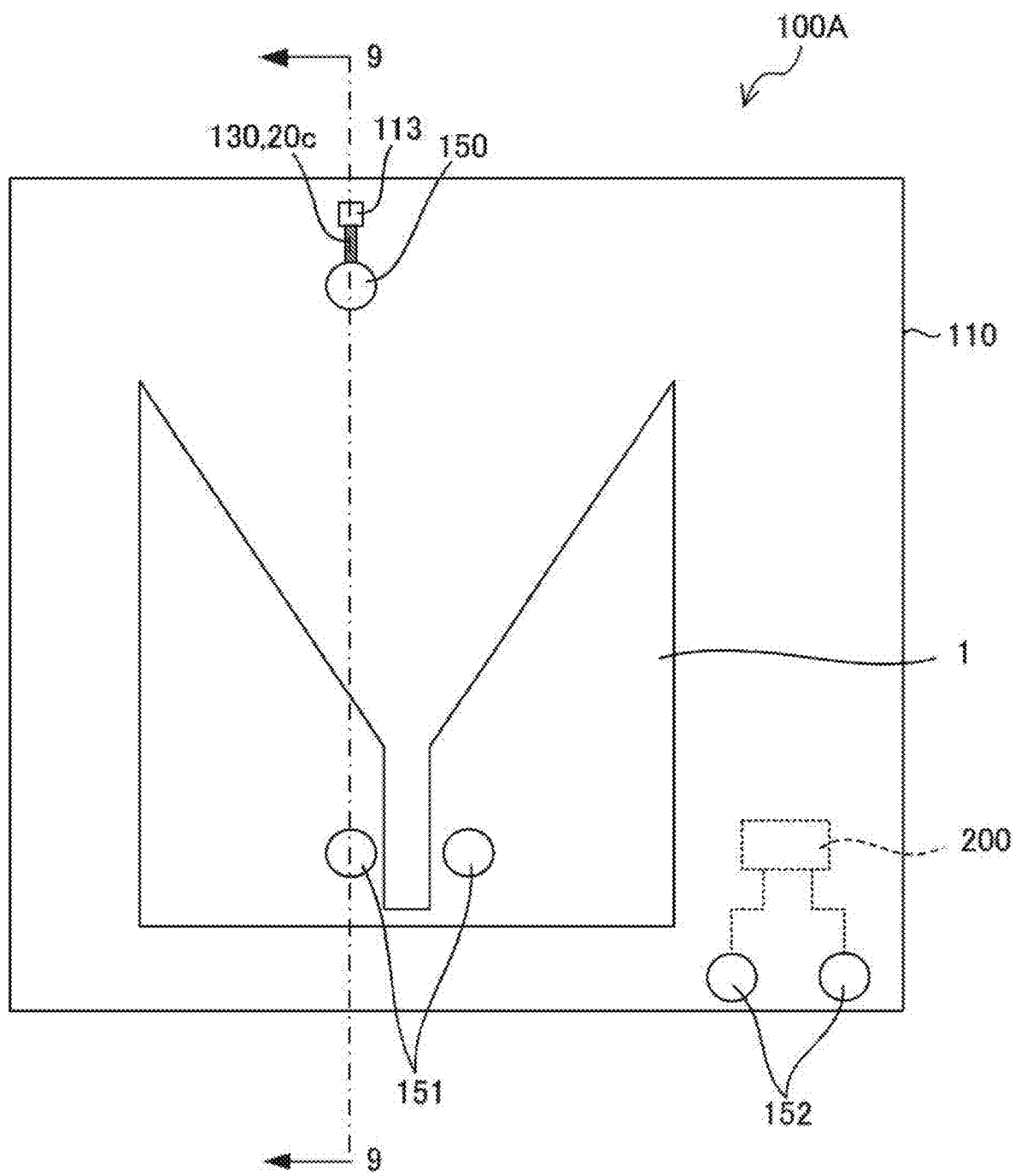
FIG. 8 is a plan view illustrating the structure of a semiconductor device according to an exemplary embodiment of the present disclosure.
Figure 9:
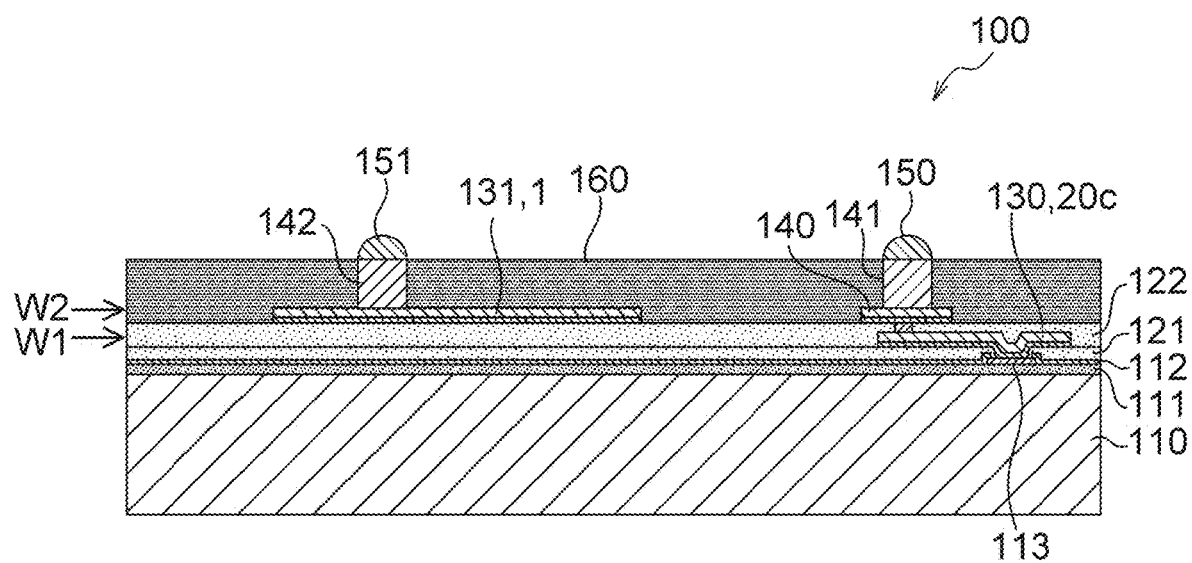
FIG. 9 is a cross-sectional view taken across a line 9-9 in FIG. 8.

FIG. 8 is a plan view illustrating an example of the structure of a semiconductor device 100A according to a third exemplary embodiment of the present disclosure. FIG. 9 is a cross-sectional view taken across a line 9-9 in FIG. 8. The semiconductor device 100A differs from the semiconductor device 100 according to the above-described second exemplary embodiment in that the signal input/output circuit 200 and the antenna 1 are not connected together. The semiconductor device 100A has external connection terminals 151 that are connected to the antenna 1, and external connection terminals 152 that are connected to the signal input/output circuit 200. The external connection terminals 151 are connected to the rewiring 131 forming the antenna 1 via a post 142.

Figure 10:
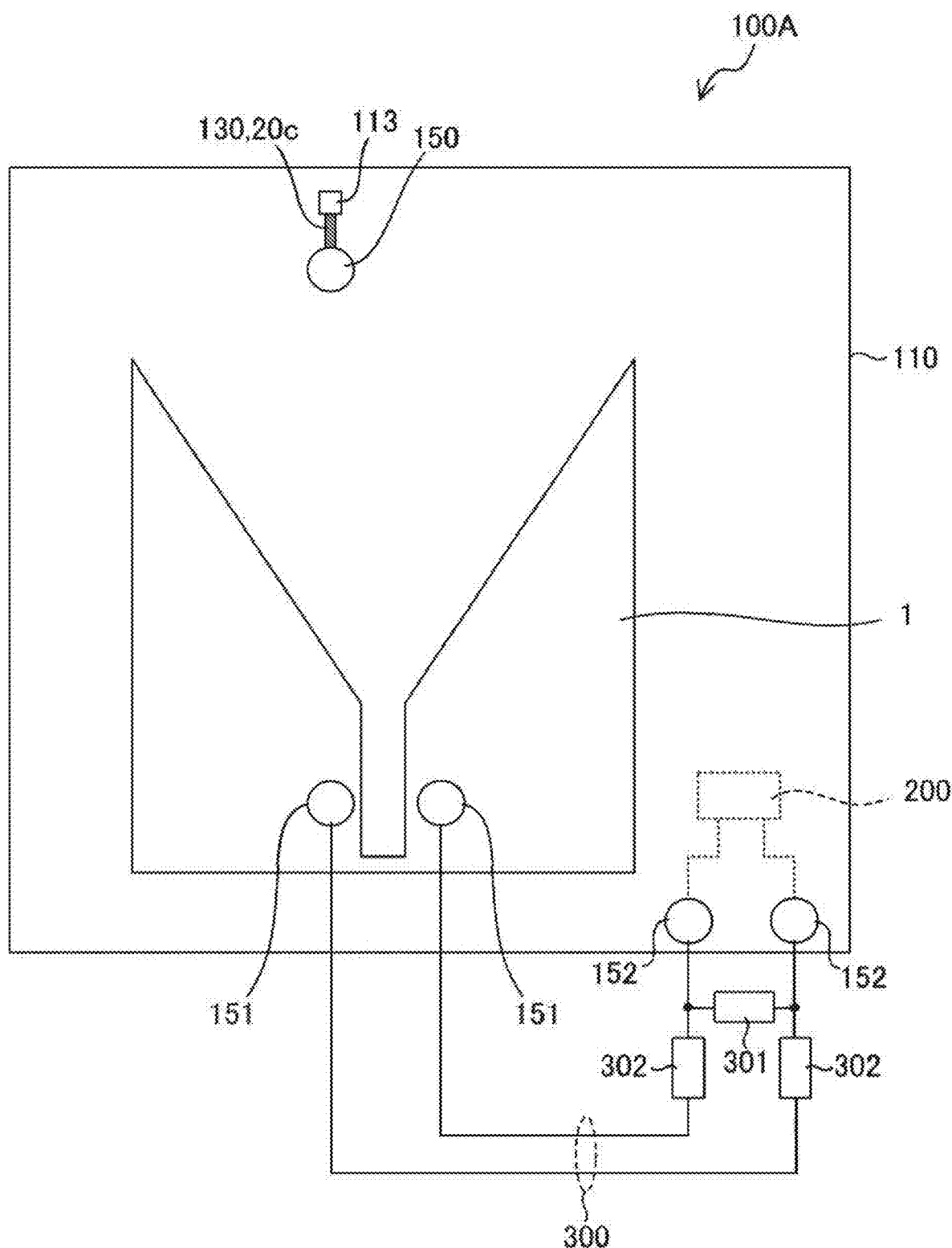
FIG. 10 is a view illustrating a state in which a connection circuit is connected to a semiconductor device according to an exemplary embodiment of the present disclosure.

As illustrated in FIG. 10, the connection between the antenna 1 and the signal input/output circuit 200 is achieved using, for example, a connecting circuit 300 that is provided externally of the semiconductor device 100A. The connecting circuit 300 may also, for example, be provided on a wiring substrate (not illustrated in the drawings) on which the semiconductor device 100A is mounted. The connecting circuit 300 may also include passive elements such as an inductor 301 and capacitors 302 that are used to match the impedance of the connecting circuit 300 to the impedances of the antenna 1 and the signal input/output circuit 200.

In this way, by removing the state of contact between the signal input/output circuit 200 and the antenna 1 within the semiconductor device 100A, and providing the eternal connection terminal 151 and the external connection terminal 152 that are connected respectively to the antenna 1 and the signal input/output circuit 200, the connection circuit 300 that connects the antenna 1 and the signal input/output circuit 200 together can be provided externally of the semiconductor device 100A. By providing the connection circuit 300 externally of the semiconductor device 100A, the impedance of the connecting circuit 300 may be adjusted with flexibility.

Moreover, according to the semiconductor device 100A of the present exemplary embodiment, since the antenna 1 has the external connection terminal 151, the antenna 1 can be connected to the signal input/output circuit provided externally of the semiconductor device 100A.

Fourth Exemplary Embodiment

Figure 11:
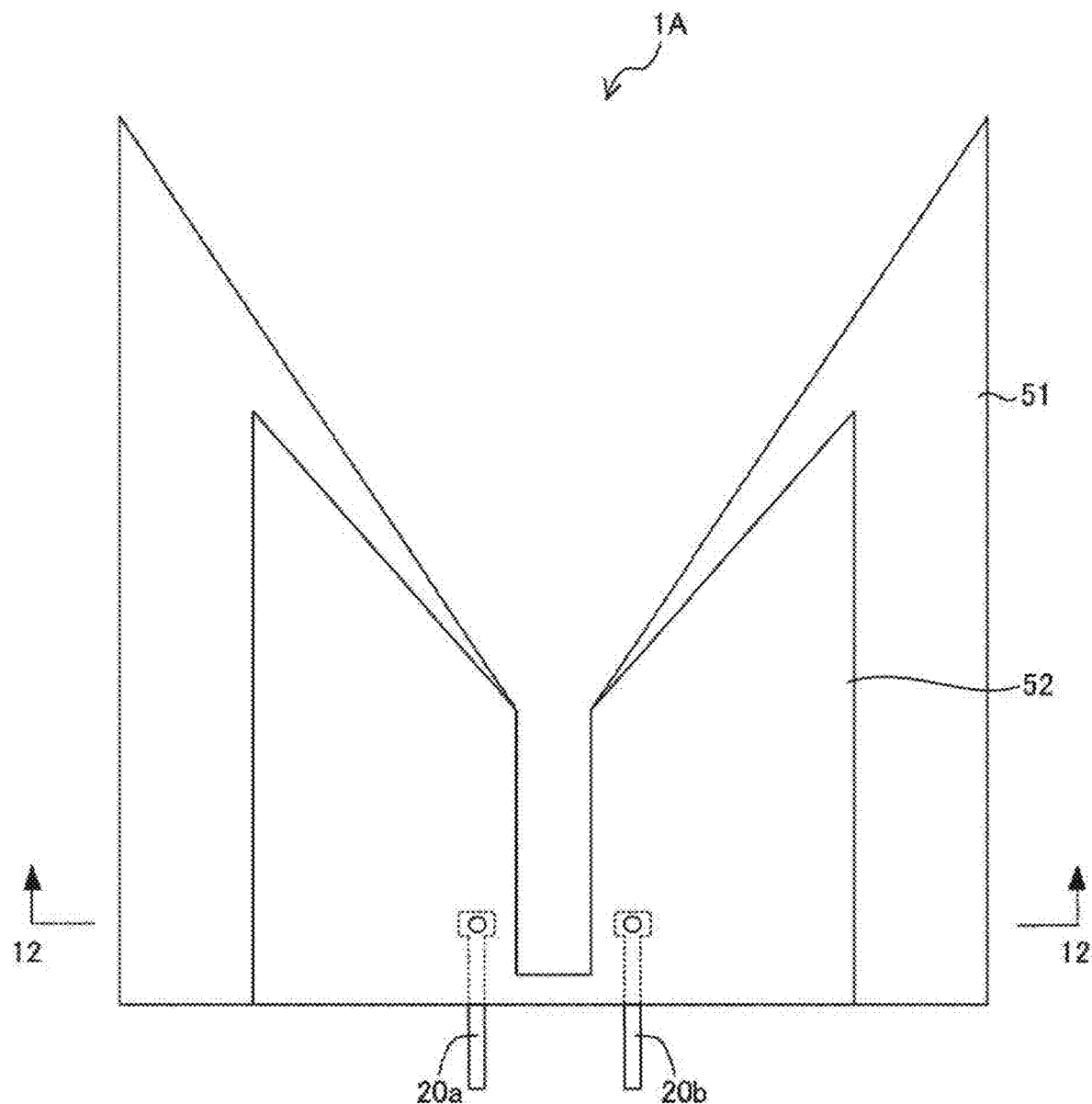
FIG. 11 is a plan view illustrating the structure of an antenna according to an exemplary embodiment of the present disclosure.
Figure 12:
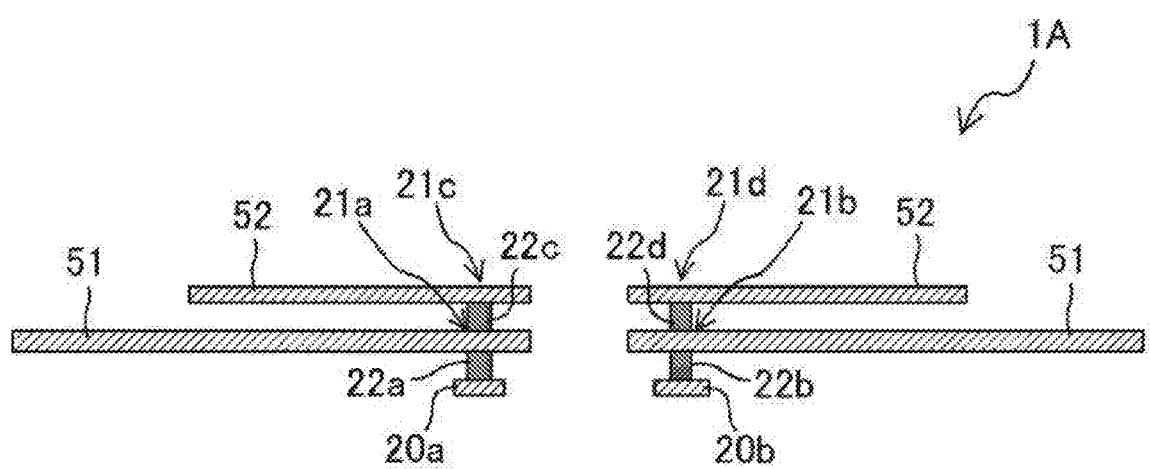
FIG. 12 is a cross-sectional view taken across a line 12-12 in FIG. 11.

FIG. 11 is a plan view illustrating an example of the structure of an antenna 1A according to a fourth exemplary embodiment of the present disclosure. FIG. 12 is a cross-sectional view taken across a line 12-12 in FIG. 11. The antenna 1A is formed so as to include a first antenna portion 51, and a second antenna portion 52 that is superimposed onto the first antenna portion 51. The second antenna portion 52 is provided at a position that overlaps with that of the first antenna portion 51.

Figure 13A:
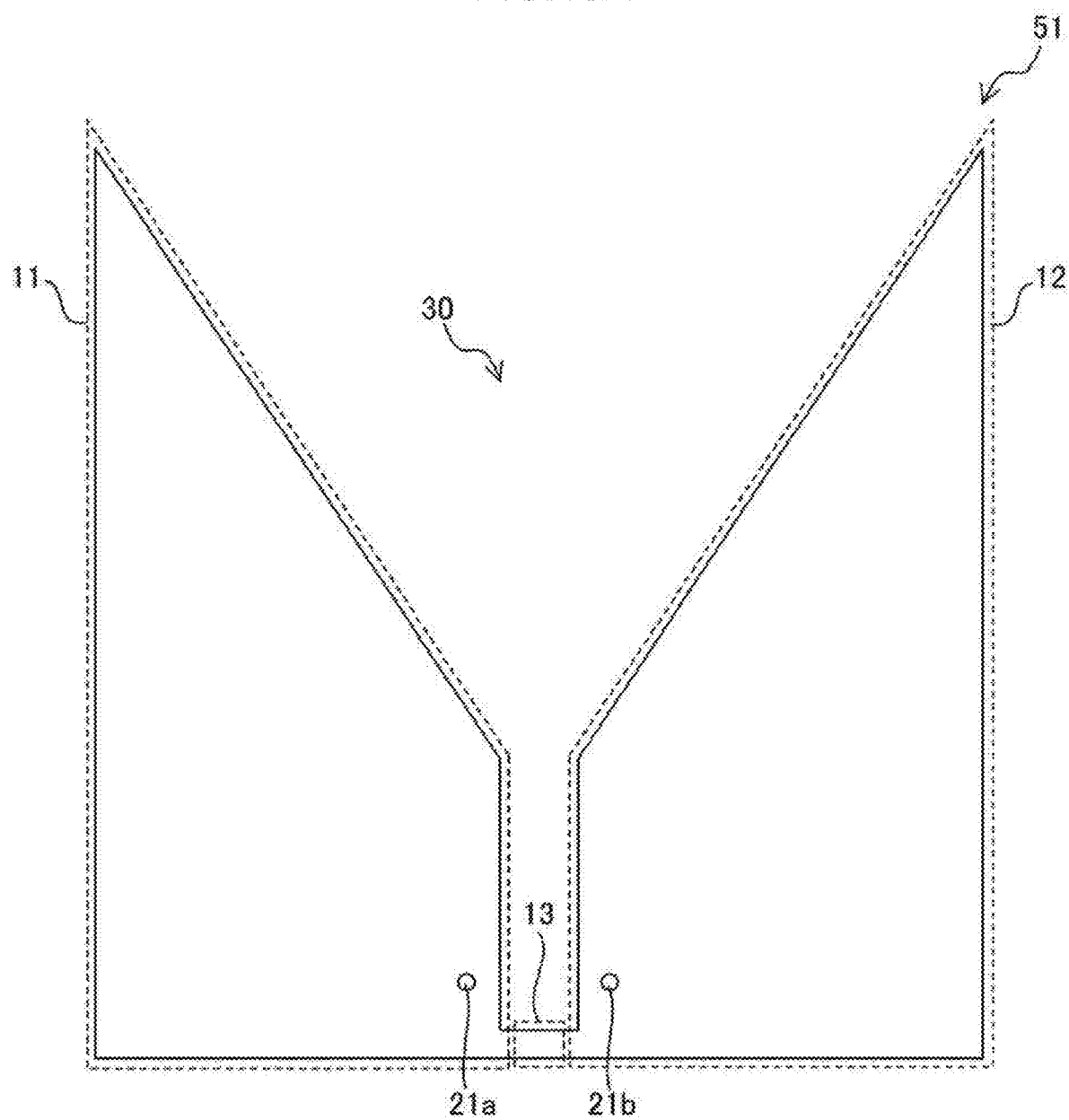
FIG. 13A is a plan view illustrating the structure of a first antenna portion according to an exemplary embodiment of the present disclosure.
Figure 13B:
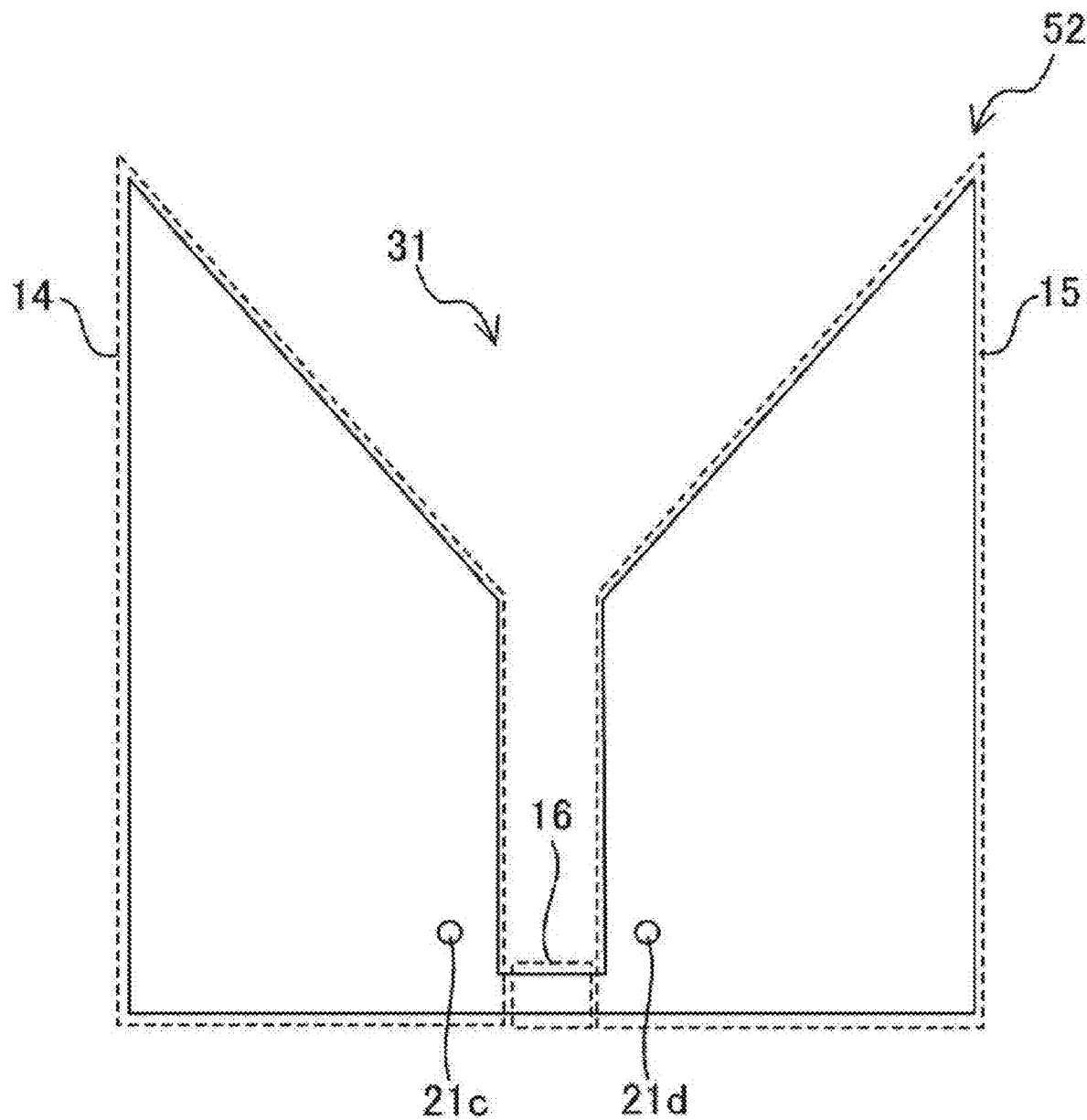
FIG. 13B is a plan view illustrating the structure of a second antenna portion according to an exemplary embodiment of the present disclosure.

FIG. 13A is a plan view illustrating an example of the structure of the first antenna portion 51. FIG. 13B is a plan view illustrating an example of the structure of the second antenna portion 52. The first antenna portion 51 has the same structure as the antenna 1 according to the first exemplary embodiment (see FIG. 1A and FIG. 2A). In other words, the first antenna portion 51 includes the first conductor portion 11 having the power supply point 21a to which one differential signal is input, the second conductor portion 12 having the power supply point 21b to which the other differential signal is input and that is separated from the first conductor portion 11 by the gap 30, and the third conductor portion 13 that connects the first conductor portion 11 to the second conductor portion 12. The gap 30 has a portion whose width becomes progressively wider in a direction moving away from third conductor portion 13.

The second antenna portion 52 has a similar external shape to the external shape of the first antenna portion 51, and has a smaller size than that of the first antenna portion 51. Note that the description 'the second antenna portion 52 has a similar external shape to that of the first antenna portion 51' means that the second antenna portion 52 has an external shape that is analogous or close to analogous to the external shape of the first antenna portion 51, and apart from their sizes, there are no conspicuous differences between the two.

The second antenna portion 52 includes a fourth conductor portion 14 having a power supply point 21c to which one differential signal is input, a fifth conductor portion 15 having a power supply point 21d to which another differential signal is input and that is separated from the fourth conductor portion 14 by a gap 31, and a sixth conductor portion 16 that connects the fourth conductor portion 14 to the fifth conductor portion 15. The gap 31 has a portion whose width becomes progressively wider in a direction moving away from sixth conductor portion 16.

The signal wiring 20a and 20b are provided in a different layer from the layer in which the first antenna portion 51 and the second antenna portion 52 are provided, and are electrically connected to the first antenna portion 51 using an interlayer connecting device such as the via 22a and the via 22b (see FIG. 12). The respective connecting portions where the first antenna portion 51 is connected to the via 22a and the via 22b are the power supply points 21a and 21b of the first antenna portion 51. The first antenna portion 51 and the second antenna portion 52 are connected to each other using an interlayer connecting device such as a via 22c and a via 22d (see FIG. 12). The respective connecting portions where the second antenna portion 52 is connected to the via 22c and the via 22d are power supply points 21c and 21d of the second antenna portion 52. The impedance of the antenna 2 can be changed by shifting the positional relationship between the power supply point 21a and the power supply point 21c, and the positional relationship between the power supply point 21b and the power supply point 21d.

According to the antenna 1A of the present exemplary embodiment, in the same way as the antenna 1 according to the first exemplary embodiment (see FIG. 1A and FIG. 2A), the trade-off relationship between antenna gain and antenna size may be improved.

Figure 14A:
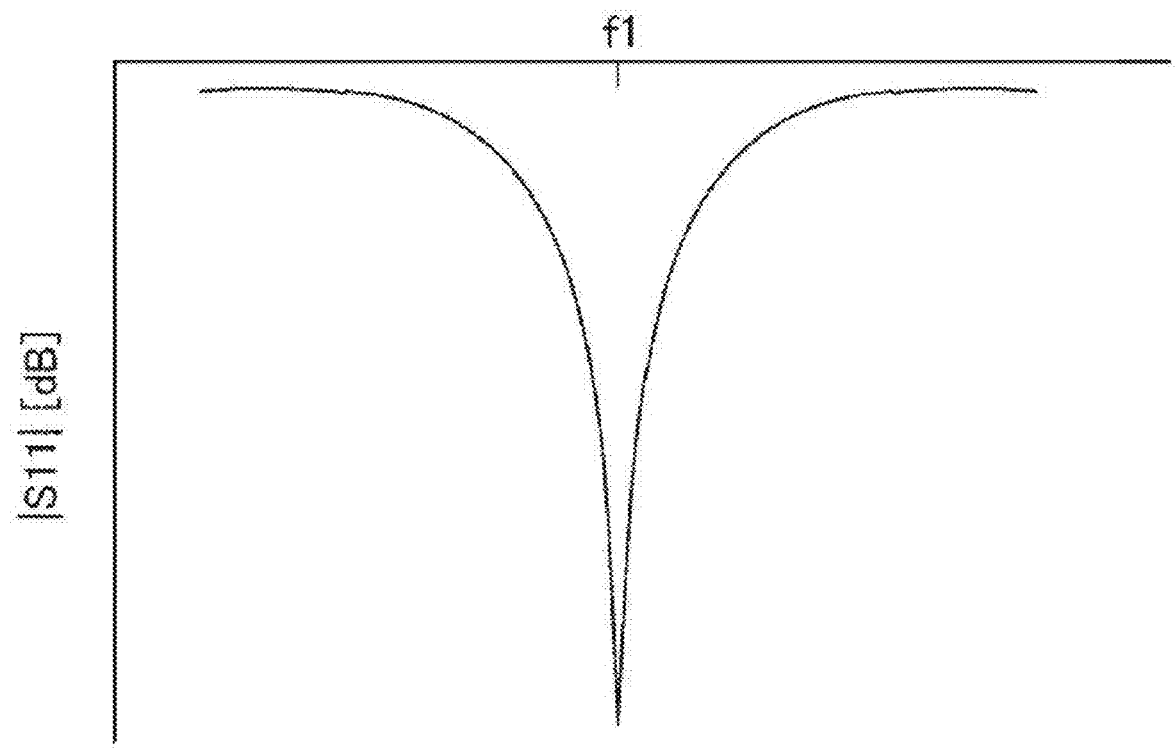
FIG. 14A is a graph illustrating frequency characteristics of an S11 parameter in a first antenna portion according to an exemplary embodiment of the present disclosure.
Figure 14B:
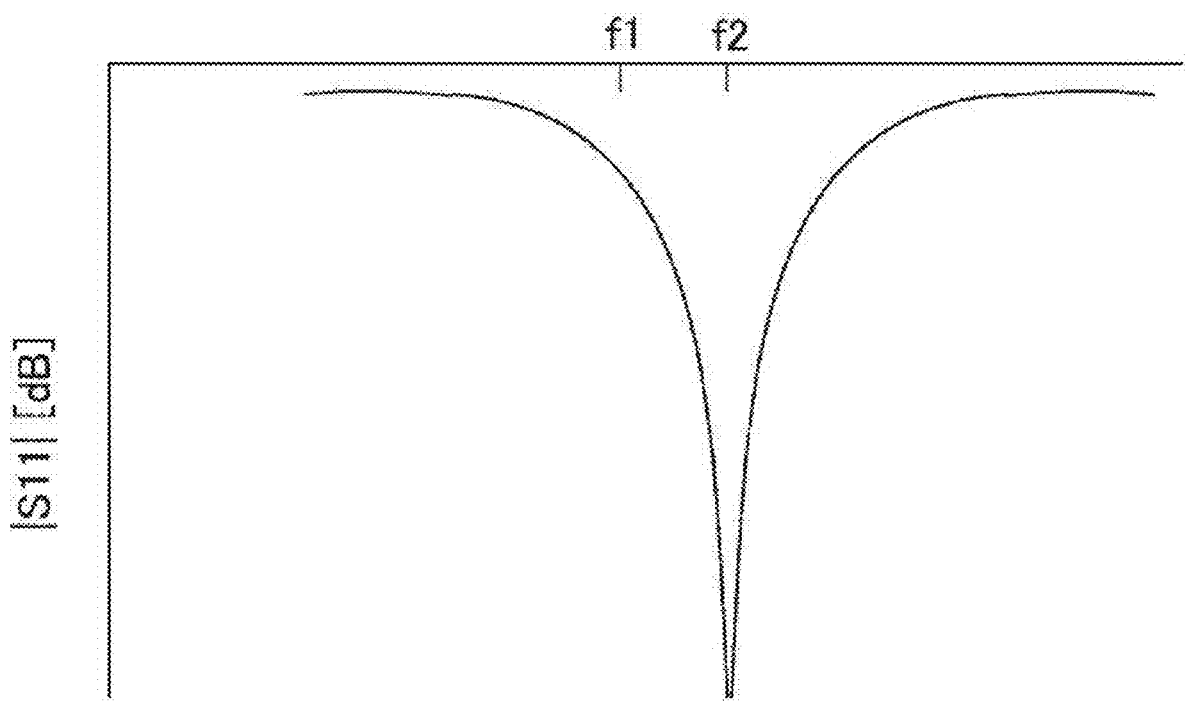
FIG. 14B is a graph illustrating frequency characteristics of an S11 parameter in a second antenna portion according to an exemplary embodiment of the present disclosure.
Figure 14C:
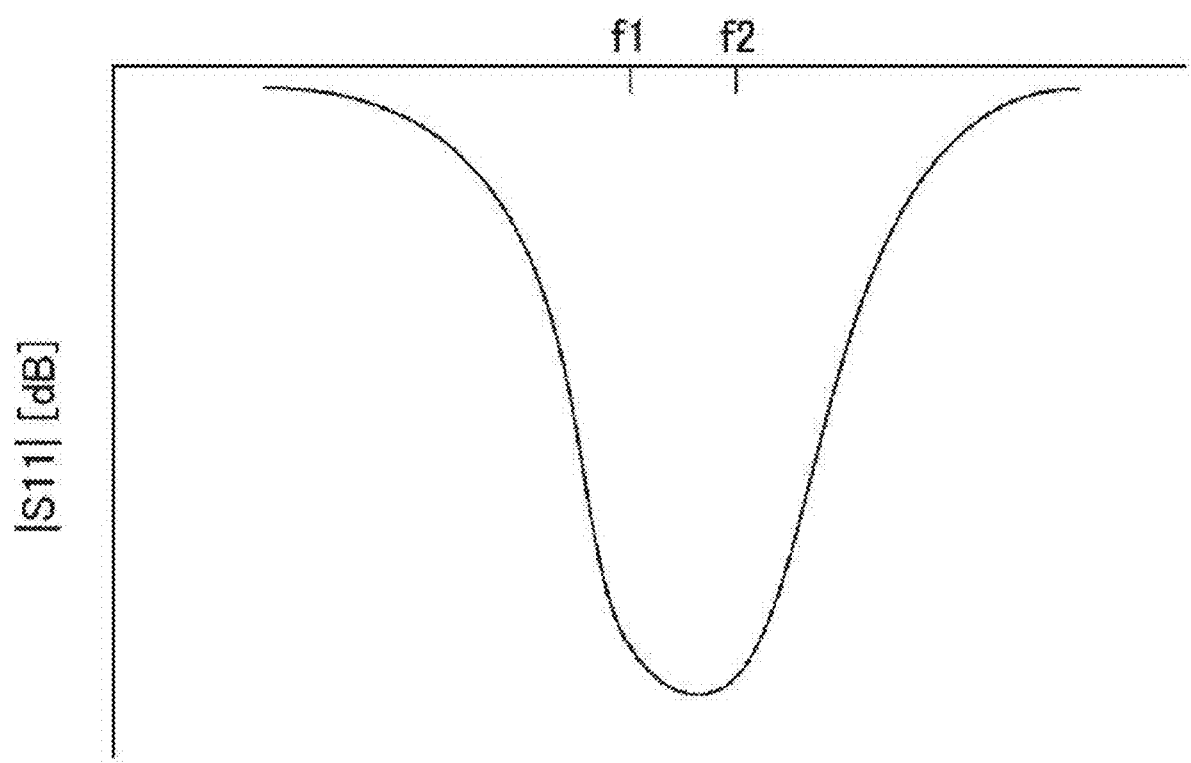
FIG. 14C is a graph illustrating an example of frequency characteristics of an S11 parameter of an entire antenna that includes both the first antenna portion and the second antenna portion according to an exemplary embodiment of the present disclosure.

Here, FIG. 14A is a graph illustrating an example of frequency characteristics of an S11 parameter of the first antenna portion 51. FIG. 14B is a graph illustrating an example of frequency characteristics of an S11 parameter of the second antenna portion 52. FIG. 14C is a graph illustrating an example of frequency characteristics of an S11 parameter of the entire antenna 1A that includes both the first antenna portion 51 and the second antenna portion 52.

As illustrated in FIG. 14A, the frequency range in the first antenna portion 51 in which signals can be emitted with a high efficiency is at the vicinity of f1. Since the second antenna portion 52 has a similar external shape to the external shape of the first antenna portion 51, and has a smaller size than that of the first antenna portion 51, as illustrated in FIG. 14B, the frequency range in the second antenna portion 52 in which signals can be emitted with a high efficiency is at the vicinity of f2 which is slightly higher than f1. Accordingly, the frequency range in the entire antenna 1A, that includes both the first antenna portion 51 and the second antenna portion 52, in which signals can be emitted with a high efficiency is a frequency range that includes f1 and f2, as illustrated in FIG. 14C. In other words, by employing a structure that includes both the first antenna portion 51 and the second antenna portion 52 whose frequency characteristics are slightly different from each other, it is possible to obtain broader frequency characteristics compared to a case in which a structure formed by one of the first antenna portion 51 or the second antenna portion 52 is employed.

Fifth Exemplary Embodiment

Figure 15:
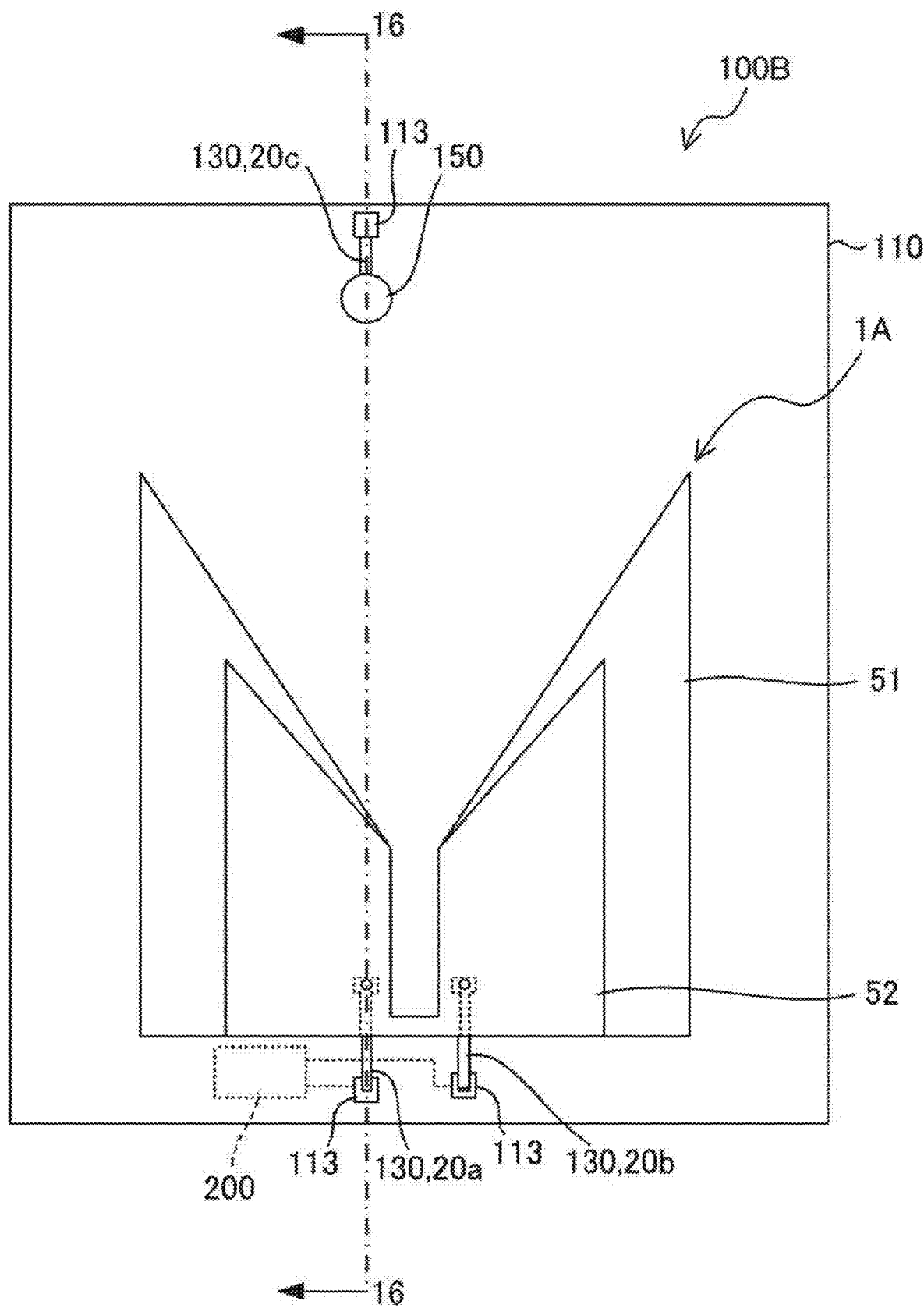
FIG. 15 is a plan view illustrating the structure of a semiconductor device according to an exemplary embodiment of the present disclosure.
Figure 16:
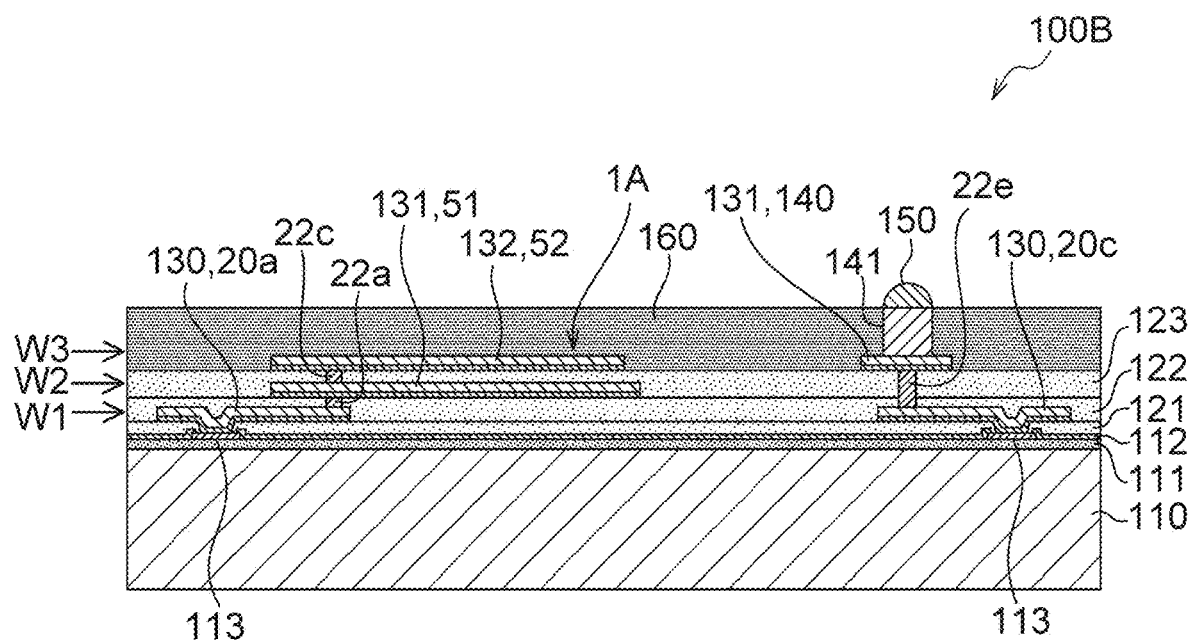
FIG. 16 is a cross-sectional view taken across a line 16-16 in FIG. 15.

FIG. 15 is a plan view illustrating an example of the structure of a semiconductor device 100B according to a fifth exemplary embodiment of the present disclosure on which the antenna 1A according to the above-described fourth exemplary embodiment is mounted. FIG. 16 is a cross-sectional view taken across a line 16-16 in FIG. 15.

In the same way as the semiconductor device 100 according to the above-described second exemplary embodiment (see FIG. 7), the package of the semiconductor device 100B is a WL-CSP type package. The signal input/output circuit 200 is formed on the semiconductor substrate 110. The semiconductor device 100B has rewiring layers W1, W2, and W3. The rewiring 130 that forms the signal wiring 20a, 20b, and 20c is provided in the rewiring layer W1. The rewiring 131 that forms the first antenna portion 51 is provided in the rewiring layer W2. The rewiring 132 that forms the second antenna portion 52 and the land 140 is provided in the rewiring layer W3.

The insulating film 122 is provided between the rewiring layer W1 and the rewiring layer W2, and the signal wiring 20a and 20b and the first antenna portion 51 are connected together by means of the via 22a and 22b (e.g., see FIG. 12). The respective connecting portions where the first antenna portion 51 is connected to the via 22a and the via 22b are the power supply points 21a and 21b of the first antenna portion 51.

An insulating film 123 is provided between the rewiring layer W2 and the rewiring layer W3, and the first antenna portion 51 and the second antenna portion 52 are connected together by means of the via 22c and 22d (e.g., see FIG. 12). The respective connecting portions where the second antenna portion 52 is connected to the via 22c and the via 22d are the power supply points 21c and 21d of the second antenna portion 52. In addition, the signal wiring 20c and the land 140 are connected together by means of the via 22e.

A post 141 formed from a conductive material such as Cu or the like is connected to the land 140. Surfaces of the insulating film 123 and the rewiring 132 are covered by the sealing resin 160 having a thickness of approximately 90 μm which is formed using a resin material such as, for example, epoxy resin or the like. The post 141 is embedded inside the sealing resin 160. The external connection terminal 150 is provided on an upper end portion of the post 141 that is exposed from the surface of the sealing resin 160. The external connection terminal 150 may also have a solder ball configuration that is formed so as to include, for example, Sn—Ag—Cu solder.

According to the semiconductor device 100B of the present exemplary embodiment, since the signal input/output circuit 200 and the antenna 1A are housed within a single semiconductor package, compared with a structure in which the antenna 1A is attached to the exterior of the semiconductor, attenuation of the signal amplitude may be inhibited. Furthermore, compared with a structure in which the antenna 1A is attached to the exterior of the semiconductor, a reduction in the size of electronic devices including the semiconductor device 100B may be achieved.

Moreover, according to the semiconductor device 100B of the present exemplary embodiment, the first antenna portion 51 is provided in the rewiring layer W2, and the second antenna portion 52 is provided in the rewiring layer W3.

Figure 17:
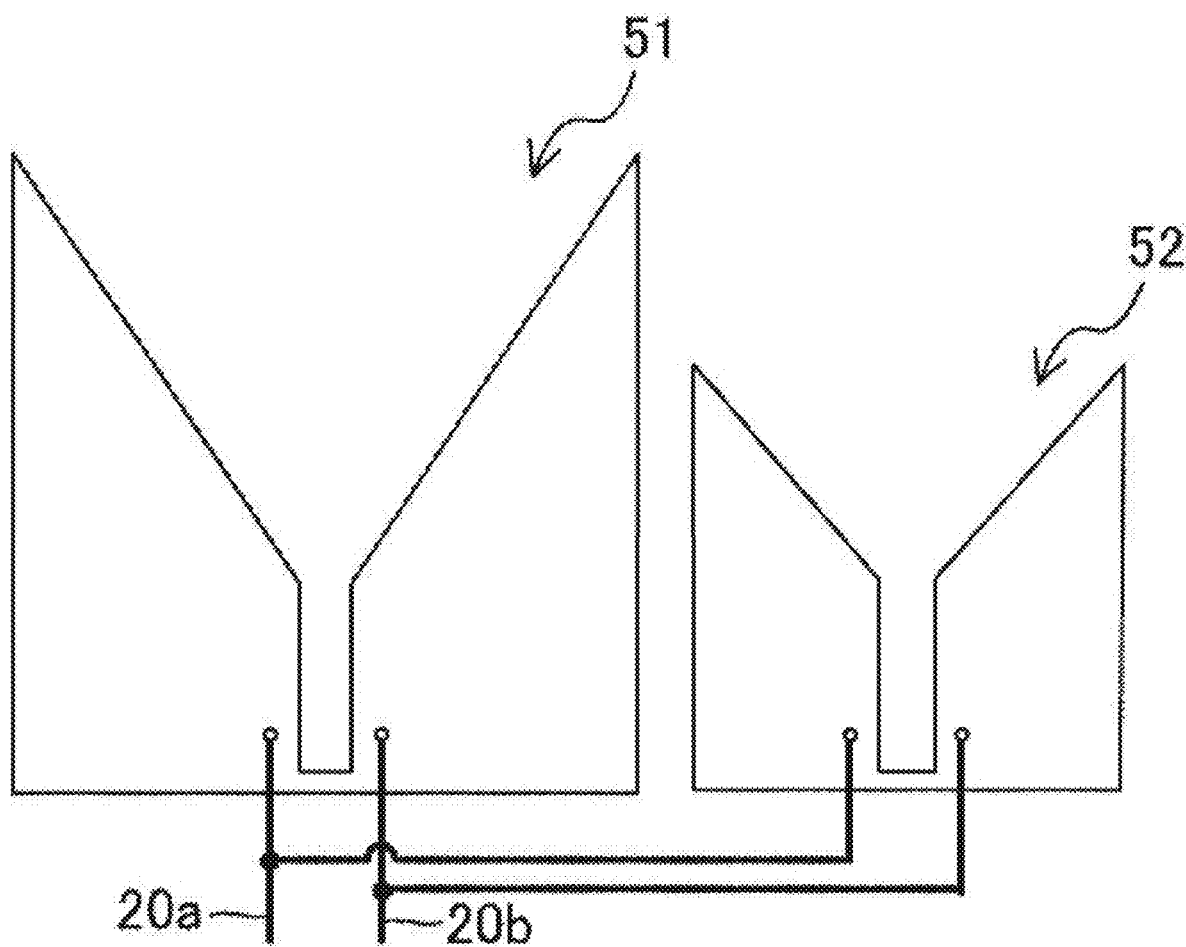
FIG. 17 is a view illustrating a structure when the first antenna portion and the second antenna portion according to an exemplary embodiment of the present disclosure are arranged side-by-side in the same rewiring layer.

Furthermore, the second antenna portion 52 is provided at a position that overlaps with that of the first antenna portion 51. Here, FIG. 17 is a view illustrating an example of a structure when the first antenna portion 51 and the second antenna portion 52 are arranged side-by-side in the same rewiring layer. In this case, as illustrated in FIG. 17, since it is necessary either for the signal wiring 20a to be placed so as to bridge the signal wiring 20b, or for the signal wiring that is connected to the first antenna portion 51 and the signal wiring that is connected to the second antenna portion 52 to be provided independently of each other, the degree of freedom in the placement of the signal wiring may be reduced.

According to the semiconductor device 100B of the present exemplary embodiment, the second antenna portion 52 is provided at a position that overlaps with that of the first antenna portion 51 in the rewiring layer W3, which is different from the rewiring layer W2 in which the first antenna portion 51 is provided. Accordingly, since the signal wiring to be connected to the second antenna portion 52 can be formed by the via 22c and the via 22d (see FIG. 12) that connect together the first antenna portion 51 and the second antenna portion 52, it is possible to avoid the above-described case that occur in a case in which the first antenna portion 51 and the second antenna portion 52 are arranged side-by-side in the same rewiring layer.

In addition, by locating the first antenna portion 51 and the second antenna portion 52 in mutually adjacent rewiring layers, in the S11 parameter frequency characteristics, broad frequency characteristics as illustrated in FIG. 14C may be obtained. In a case in which the first antenna portion 51 is disposed in a rewiring layer provided on the front surface side of the semiconductor substrate 110, and the second antenna portion 52 is disposed in a rewiring layer provided on the rear surface side of the semiconductor substrate 110, then it would be difficult to bring the frequency characteristics of the two close together, due to the semiconductor substrate 110 being interposed between the first antenna portion 51 and the second antenna portion 52. As a result, it would be difficult to obtain broad frequency characteristics such as those illustrated in FIG. 14C. However, according to the semiconductor device 100B of the present exemplary embodiment, since the first antenna portion 51 and the second antenna portion 52 are each disposed in mutually adjacent rewiring layers, the frequency characteristics of the two antenna portions may be brought close together by adjusting the antenna sizes thereof. As a result of this, in the S11 parameter frequency characteristics, broad frequency characteristics such as those illustrated in FIG. 14C may be obtained.

Sixth Exemplary Embodiment

Figure 18:
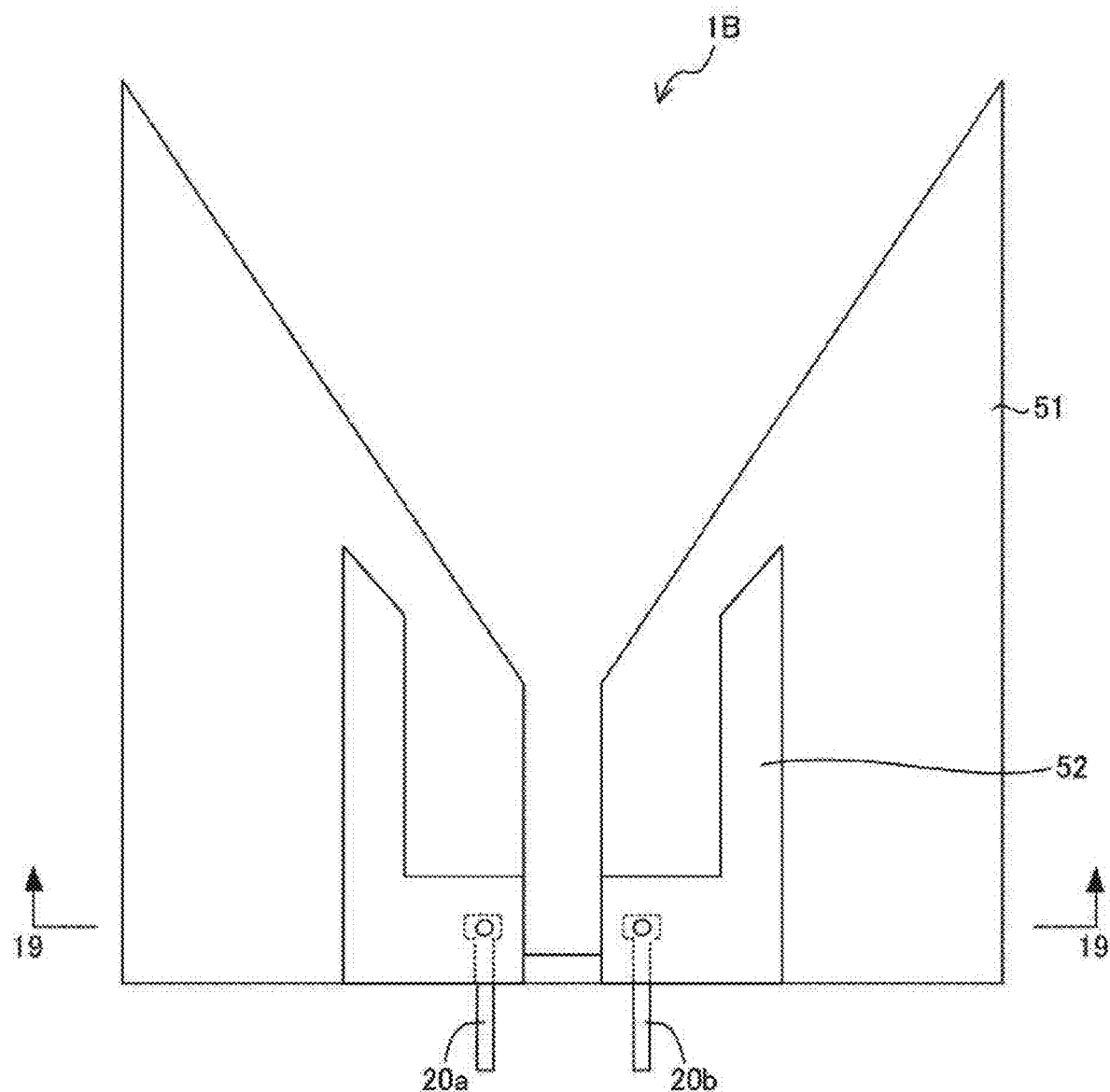
FIG. 18 is a plan view illustrating the structure of an antenna according to an exemplary embodiment of the present disclosure.
Figure 19:
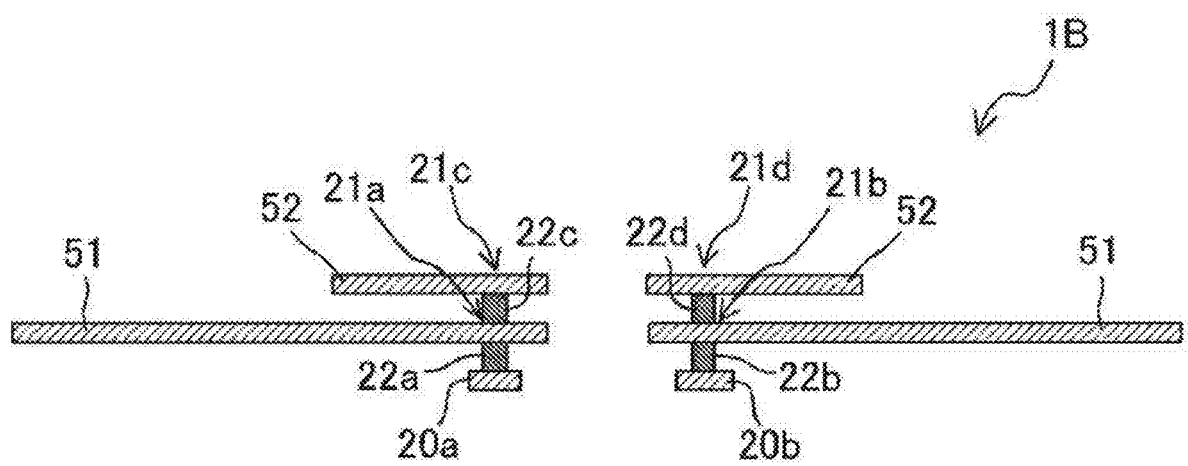
FIG. 19 is a cross-sectional view taken across a line 19-19 in FIG. 18.

FIG. 18 is a plan view illustrating an example of the structure of an antenna 1B according to a sixth exemplary embodiment of the present disclosure. FIG. 19 is a cross-sectional view taken across a line 19-19 in FIG. 18. The antenna 1B is formed including the first antenna portion 51, and the second antenna portion 52 that is superimposed on the first antenna portion 51. In other words, the second antenna portion 52 is provided at a position that overlaps with that of the first antenna portion 51.

Figure 20A:
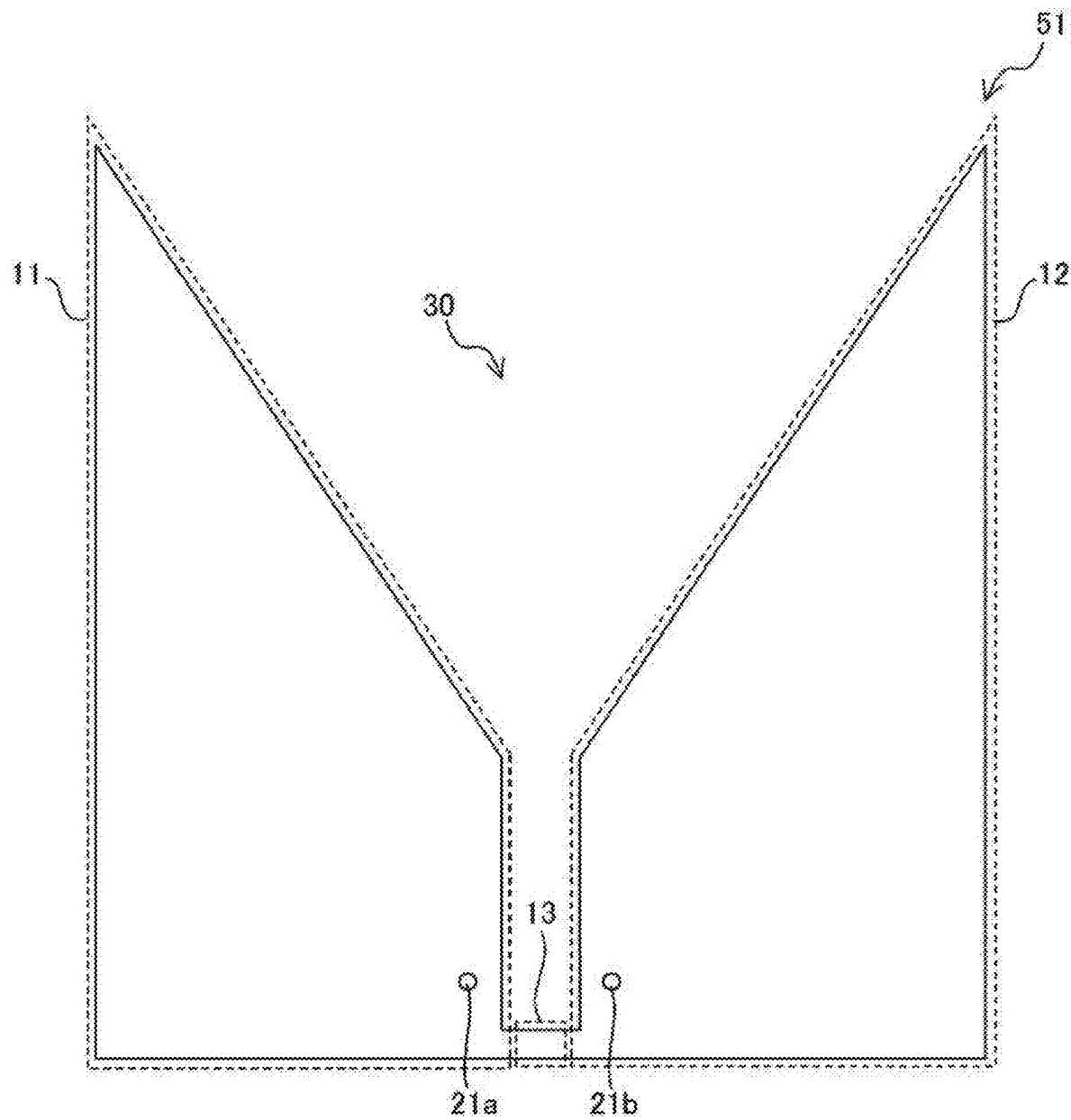
FIG. 20A is a plan view illustrating the structure of a first antenna portion according to an exemplary embodiment of the present disclosure.
Figure 20B:
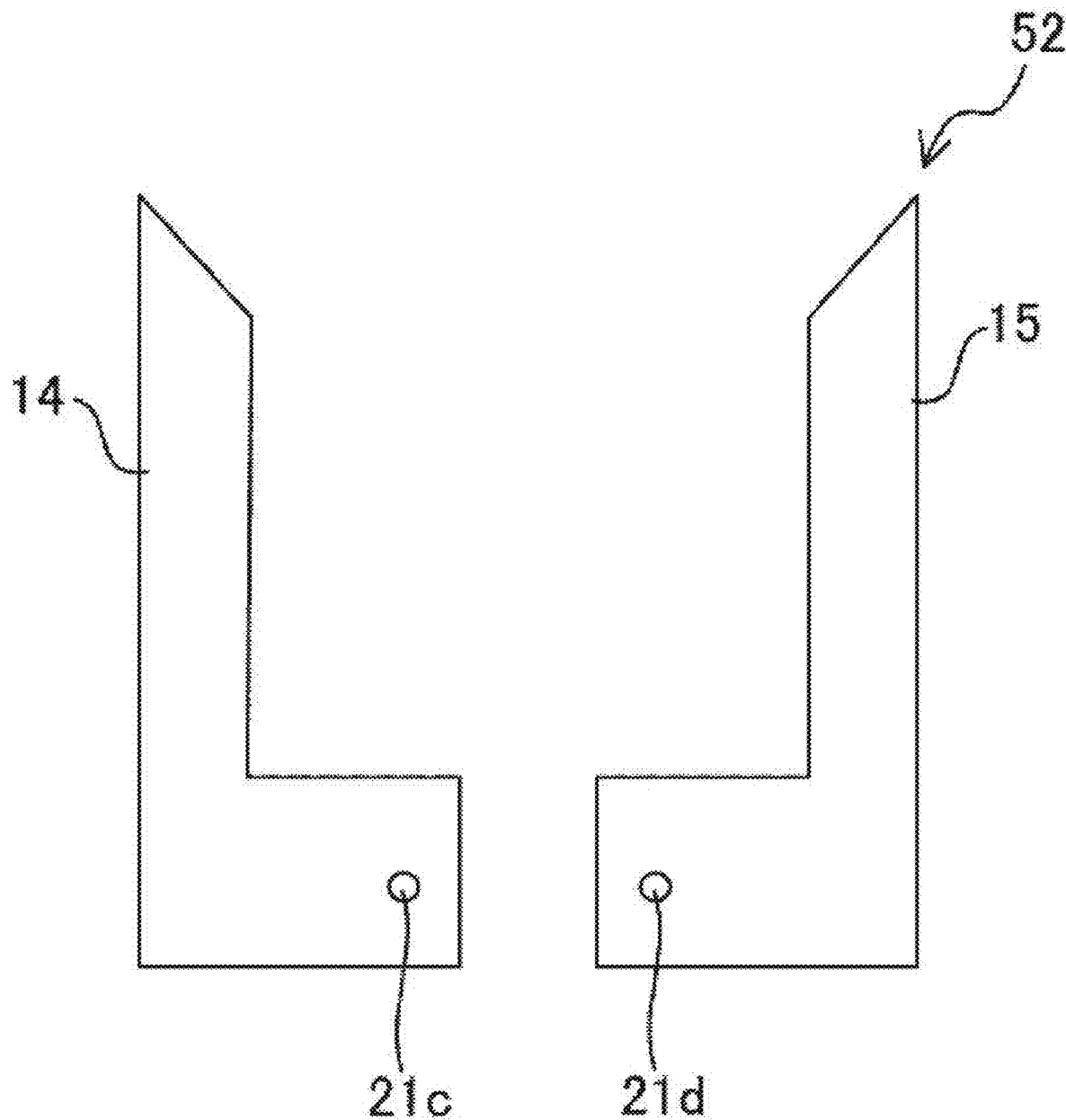
FIG. 20B is a plan view illustrating the structure of a second antenna portion according to an exemplary embodiment of the present disclosure.

FIG. 20A is a plan view illustrating an example of the structure of the first antenna portion 51. FIG. 20B is a plan view illustrating an example of the structure of the second antenna portion 52. The first antenna portion 51 has the same structure as the antenna 1 according to the first exemplary embodiment. In other words, the first antenna portion 51 includes the first conductor portion 11 having the power supply point 21a to which one differential signal is input, the second conductor portion 12 having the power supply point 21b to which the other differential signal is input and that is separated from the first conductor portion 11 by the gap 30, and the third conductor portion 13 that connects the first conductor portion 11 to the second conductor portion 12. The gap 30 has a portion whose width becomes progressively wider in a direction moving away from third conductor portion 13.

The second antenna portion 52 has a dissimilar external shape from the external shape of the first antenna portion 51, and has a smaller size than that of the first antenna portion 51. Note that the description 'the second antenna portion 52 has a dissimilar external shape from that of the first antenna portion 51' means that the second antenna portion 52 has an external shape that is markedly different from the external shape of the first antenna portion 51, and it can be confirmed that the two are not in any united or similar relationship.

The second antenna portion 52 includes the fourth conductor portion 14 having the power supply point 21c to which one differential signal is input, and the fifth conductor portion 15 having the power supply point 21d to which another differential signal is input, and that is separated from the fourth conductor portion 14 by a gap. In other words, the second antenna portion 52 is formed by two conductor portions that are completely separated from each other.

The signal wiring 20a and 20b are provided in a different layer from the layer in which the first antenna portion 51 and the second antenna portion 52 are provided, and are electrically connected to the first antenna portion 51 using an interlayer connecting device such as the via 22a and the via 22b. The respective connecting portions where the first antenna portion 51 is connected to the via 22a and the via 22b are the power supply points 21a and 21b of the first antenna portion 51. The first antenna portion 51 and the second antenna portion 52 are connected to each other using an interlayer connecting device such as a via 22c and a via 22d. The respective connecting portions where the second antenna portion 52 is connected to the via 22c and the via 22d are power supply points 21d and 21d of the second antenna portion 52.

In the same way as the antenna 1 of the first exemplary embodiment (see FIG. 1A and FIG. 2A), the antenna 1B of the present exemplary embodiment may improve the trade-off relationship between antenna gain and antenna size.

Figure 21A:
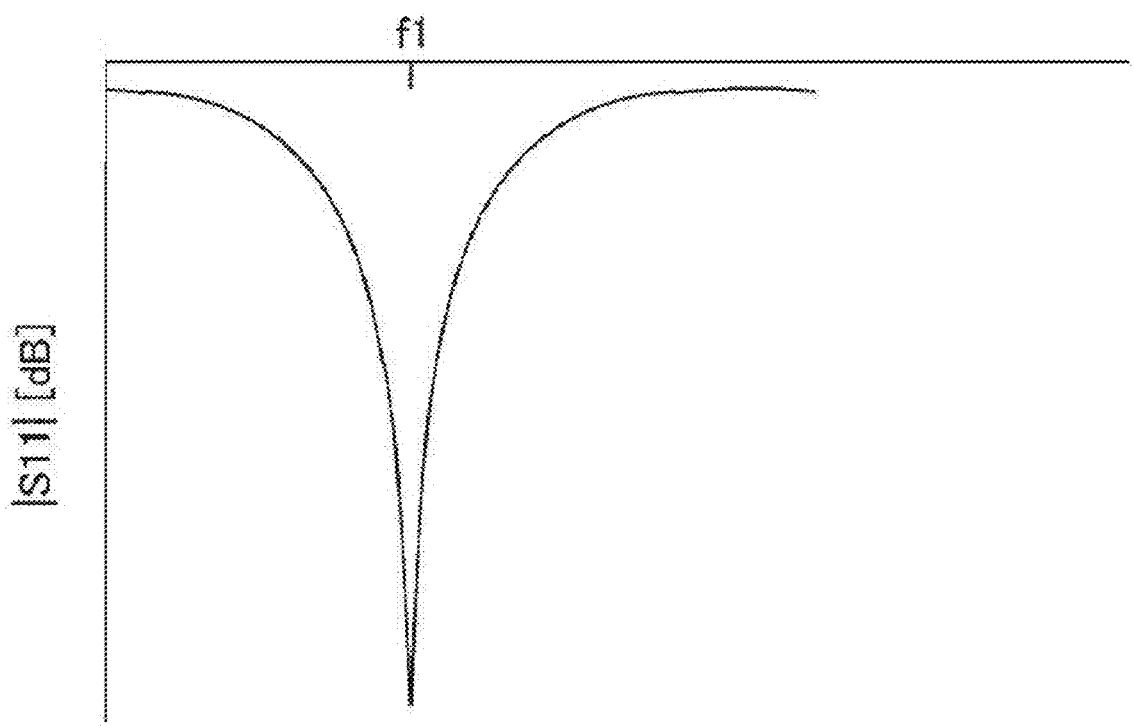
FIG. 21A is a graph illustrating frequency characteristics of an S11 parameter in a first antenna portion according to an exemplary embodiment of the present disclosure.
Figure 21B:
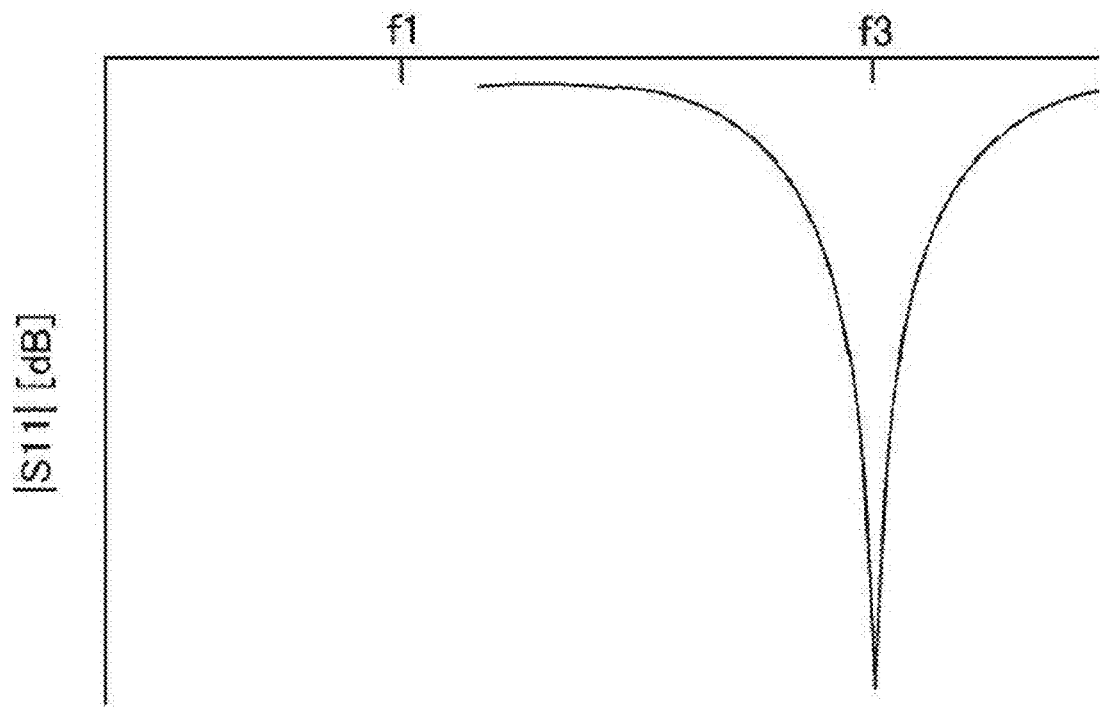
FIG. 21B is a graph illustrating frequency characteristics of an S11 parameter in a second antenna portion according to an exemplary embodiment of the present disclosure.
Figure 21C:
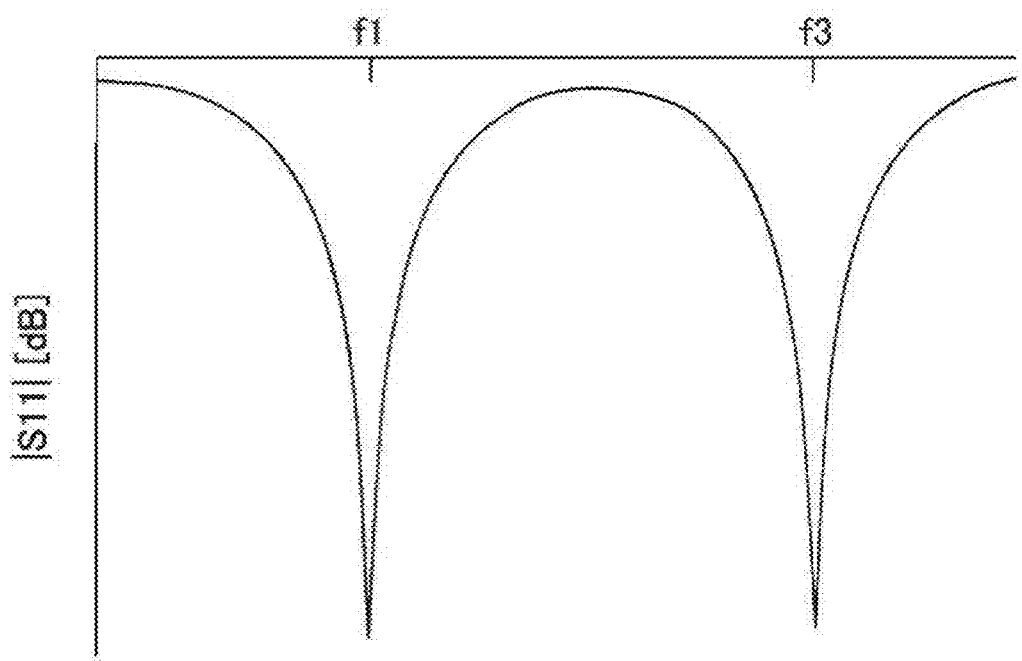
FIG. 21C is a graph illustrating frequency characteristics of an S11 parameter of an entire antenna that includes both the first antenna portion and the second antenna portion according to an exemplary embodiment of the present disclosure.

Here, FIG. 21A is a graph illustrating an example of frequency characteristics of an S11 parameter of the first antenna portion 51. FIG. 21B is a graph illustrating an example of frequency characteristics of an S11 parameter of the second antenna portion 52. FIG. 21C is a graph illustrating an example of frequency characteristics of an S11 parameter of the entire antenna 1B that includes both the first antenna portion 51 and the second antenna portion 52.

As illustrated in FIG. 21A, in the first antenna portion 51, the frequency range in which signals can be emitted with a high efficiency is at the vicinity of f1. Since the second antenna portion 52 has a dissimilar external shape to the external shape of the first antenna portion 51, and has a smaller size than that of the first antenna portion 51, the frequency range in the second antenna portion 52 in which signals can be emitted with a high efficiency is at the vicinity of f3 which is markedly higher than f1. Accordingly, as illustrated in FIG. 21C, the frequency range in the entire antenna 1B that includes both the first antenna portion 51 and the second antenna portion 52 in which signals can be emitted with a high efficiency includes f1 and f3. In other words, by employing a structure that includes both the first antenna portion 51 and the second antenna portion 52 whose frequency characteristics are markedly different from each other, it is possible to cause the antenna 1B to function as a multi-frequency antenna.

Note that the antenna 1B of the present exemplary embodiment is capable of being mounted on a semiconductor device having the same structure as the semiconductor device 100B (see FIG. 15 and FIG. 16) according to the above-described fifth exemplary embodiment.

In the foregoing description, cases in which the antennas 1A and 1B according to exemplary embodiments of the present disclosure are provided in a rewiring layer of a semiconductor device, are described. However, the present disclosure is not limited to this configuration. The antennas 1A and 1B according to exemplary embodiments may be provided, for example, in a wiring layer of a rigid substrate, of a flexible substrate, or of wiring substrate for a BGA package. Additionally, the antennas 1A and 1B according to exemplary embodiments may also be formed by a UBM film provided in a rewiring layer.

Exemplary embodiments of the present disclosure have been described above, however, the present disclosure is not limited to these. Various modifications and the like may be made to the present disclosure insofar as they do not depart from the spirit or scope of the present disclosure.

An aspect of the present disclosure is a semiconductor device including: a semiconductor substrate; a wiring layer provided at a surface of the semiconductor substrate; a first rewiring layer provided at a surface of the wiring layer, with a first insulating layer provided between the first rewiring layer and the surface of the wiring layer; a second rewiring layer provided at a surface of the first rewiring layer, with a second insulating layer provided between the second rewiring layer and the surface of the first rewiring layer; a first antenna portion provided on the first rewiring layer; and a second antenna portion provided on the second rewiring layer at a position that overlaps with the first antenna portion.

In the above aspect, the first antenna portion may include: a first conductor portion including a power supply point at which one of a pair of differential signals is input; a second conductor portion including a power supply point at which another one of the pair of differential signals is input, the second conductor portion being separated by a gap from the first conductor portion; and a third conductor portion that connects the first conductor portion with the second conductor portion, wherein the gap may include a portion having a width that becomes progressively wider in a direction moving away from the third conductor portion.

In the above aspects, the second antenna portion may include: a fourth conductor portion including a power supply point at which the one of the pair of differential signals is input; a fifth conductor portion including a power supply point at which the other of the pair of differential signals is input, the fifth conductor portion being separated by a gap from the fourth conductor portion; and a sixth conductor portion that connects the fourth conductor portion with the fifth conductor portion, wherein the gap that separates the fourth conductor portion from the fifth conductor portion may include a portion having a width that becomes progressively wider in a direction moving away from the sixth conductor portion, and wherein the second antenna portion may have a size that differs from a size of the first antenna portion.

In the above aspects, the second antenna portion may have an external shape similar to an external shape of the first antenna portion.

In the above aspects, the second antenna portion may have an external shape that differs from an external shape of the first antenna portion.

In the above aspects, an external shape of the first antenna portion may be line-symmetric to an external shape of the second antenna portion.

What is claimed is:

1. An antenna comprising:
   a first conductor portion formed on a surface of a semiconductor substrate and including a power supply point at which one of a pair of differential signals is input;
   a second conductor portion formed on the surface of the semiconductor substrate and including a power supply point at which another one of the pair of differential signals is input, the second conductor portion being separated by a gap from the first conductor portion so that one side of the second conductor portion faces one side of the first conductor portion; and
   a third conductor portion formed on the surface of the semiconductor substrate and that connects one end of the one side of the first conductor portion with one end of the one side of the second conductor portion,
   wherein the gap includes a portion having a width that becomes progressively wider in a direction moving away from the third conductor portion toward another end of the one side of the first conductor portion and another end of the one side of the second conductor portion.

2. The antenna according to claim 1, wherein an external shape formed by the first conductor portion, the second conductor portion and the third conductor portion, is line-symmetric.

3. An antenna comprising:
   a first antenna portion and a second antenna portion, the first antenna portion comprising
   a first conductor portion formed on a surface of a semiconductor substrate and including a power supply point at which one of a pair of differential signals is input,
   a second conductor portion formed on the surface of the semiconductor substrate and including a power supply point at which another one of the pair of differential signals is input, the second conductor portion being separated by a gap from the first conductor portion so that one side of the second conductor portion faces one side of the first conductor portion, and
   a third conductor portion formed on the surface of the semiconductor substrate and that connects one end of the one side of the first conductor portion with one end of the one side of the second conductor portion,
   wherein the gap includes a portion having a width that becomes progressively wider in a direction moving away from the third conductor portion toward another end of the one side of the first conductor portion and another end of the one side of the second conductor portion.

4. The antenna according to claim 3, wherein the second antenna portion comprises:
   a fourth conductor portion formed over the surface of the semiconductor substrate and including a power supply point at which the one of the pair of differential signals is input;
   a fifth conductor portion formed over the surface of the semiconductor substrate and including a power supply point at which the another one of the pair of differential signals is input, the fifth conductor portion being separated by a gap from the fourth conductor portion so that one side of the fourth conductor portion faces one side of the fifth conductor portion; and
   a sixth conductor portion formed over the surface of the semiconductor substrate and that connects one end of the one side of the fourth conductor portion with one end of the one side of the fifth conductor portion,
   wherein the gap that separates the fourth conductor portion from the fifth conductor portion includes a portion having a width that becomes progressively wider in a direction moving away from the sixth conductor portion toward another end of the one side of the fourth conductor portion and another end of the one side of the fifth conductor portion, and
   wherein the second antenna portion has a size that differs from a size of the first antenna portion.

5. The antenna according to claim 3, wherein the second antenna portion has an external shape similar to an external shape of the first antenna portion.

6. The antenna according to claim 3, wherein the second antenna portion has an external shape that differs from an external shape of the first antenna portion.

7. The antenna according to claim 3, wherein an external shape of the first antenna portion is line-symmetric to an external shape of the second antenna portion.

8. The antenna according to claim 3, wherein the second antenna portion is provided at a position that overlaps with the first antenna portion.

9. A semiconductor device comprising:
   a semiconductor substrate;
   a wiring layer provided at a surface of the semiconductor substrate;
   a rewiring layer provided at a surface of the wiring layer, with an insulating layer provided between the rewiring layer and the surface of the wiring layer; and
   an antenna provided on the rewiring layer, the antenna comprising
   a first conductor portion formed on a surface of a semiconductor substrate and including a power supply point at which one of a pair of differential signals is input,
   a second conductor portion formed on the surface of the semiconductor substrate and including a power supply point at which another one of the pair of differential signals is input, the second conductor portion being separated by a gap from the first conductor portion so that one side of the second conductor portion faces one side of the first conductor portion, and
   a third conductor portion formed on the surface of the semiconductor substrate and that connects one end of the one side of the first conductor portion with one end of the one side of the second conductor portion,
   wherein the gap includes a portion having a width that becomes progressively wider in a direction moving away from the third conductor portion toward another end of the one side of the first conductor portion and another end of the one side of the second conductor portion.

10. The semiconductor device according to claim 9, further comprising external connection terminals that are connected to each of the power supply points.

* * * * *